United States Patent
Yang et al.

(10) Patent No.: US 9,543,285 B2
(45) Date of Patent: Jan. 10, 2017

(54) DISPLAY PANEL

(71) Applicant: Novatek Microelectronics Corp., Hsinchu (TW)

(72) Inventors: Kai-Min Yang, Kaohsiung (TW); Hsueh-Yen Yang, Taoyuan (TW); Feng-Ting Pai, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 43 days.

(21) Appl. No.: 14/664,901

(22) Filed: Mar. 22, 2015

(65) Prior Publication Data

US 2016/0204094 A1   Jul. 14, 2016

(30) Foreign Application Priority Data

Jan. 12, 2015   (TW) .............................. 104100958 A

(51) Int. Cl.
  *H01L 29/49*   (2006.01)
  *H01L 27/02*   (2006.01)
  *H01L 27/12*   (2006.01)

(52) U.S. Cl.
  CPC ......... *H01L 27/0207* (2013.01); *H01L 27/124* (2013.01)

(58) Field of Classification Search
  CPC .............. H01L 27/0207; H01L 27/124; H01L 27/3206; H01L 27/3211; G02F 1/136222
  See application file for complete search history.

(56) References Cited

U.S. PATENT DOCUMENTS

| 7,893,904 | B2 | 2/2011 | Shih et al. | |
|---|---|---|---|---|
| 2004/0080844 | A1 | 4/2004 | Cheng et al. | |
| 2006/0221030 | A1 | 10/2006 | Shih et al. | |
| 2012/0242723 | A1* | 9/2012 | Miyake | G09G 3/32 345/694 |
| 2015/0116555 | A1* | 4/2015 | Hayashi | H04N 9/045 348/280 |

(Continued)

FOREIGN PATENT DOCUMENTS

| TW | i242080 | 10/2005 |
|---|---|---|
| TW | 200634698 | 10/2006 |

OTHER PUBLICATIONS

"Office Action of Taiwan Counterpart Application," issued on Sep. 10, 2016, p. 1-p. 7, in which the listed foreign references were cited.

*Primary Examiner* — Michael Shingleton
(74) *Attorney, Agent, or Firm* — Jianq Chyun IP Office

(57) ABSTRACT

A display panel including a plurality of sub-pixel groups arranged repeatedly to form a pixel array. Each of the sub-pixel groups includes a plurality of first pixel units, a plurality of second pixel units and a plurality of third pixel units. Each of the first pixel units includes a first color sub-pixel and a second color sub-pixel, each of the second pixel units includes the second color sub-pixel and a third color sub-pixel, and each of the third pixel units includes the first color sub-pixel and the third color sub-pixel. The first color sub-pixel, the second color sub-pixel and the third color sub-pixel are sub-pixels having three different colors. At least a part of the first pixel units and at least a part of the second pixel units are arranged along a first direction, and the first direction is tilted relative to a column direction of the pixel array.

17 Claims, 17 Drawing Sheets

(56) References Cited

U.S. PATENT DOCUMENTS

2015/0185546 A1* 7/2015 Lee .................... G02F 1/13363
  349/33
2016/0077384 A1* 3/2016 Yang ................. G02F 1/133723
  349/128
2016/0182881 A1* 6/2016 Thiebaud ........... H04N 13/0029
  348/43

* cited by examiner

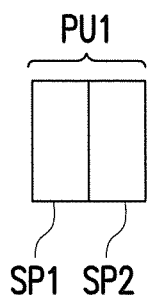
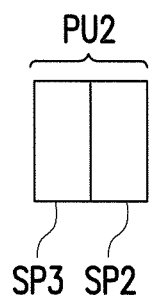
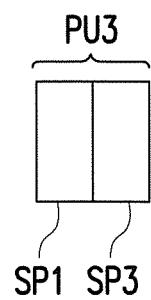
FIG. 3A     FIG. 3B     FIG. 3C
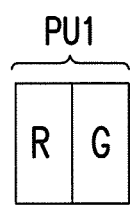
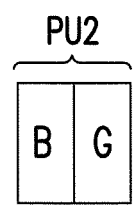
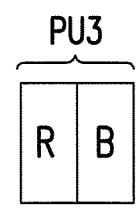
FIG. 4A     FIG. 4B     FIG. 4C
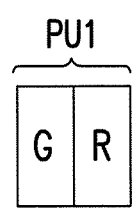
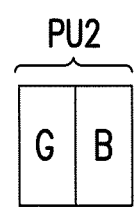
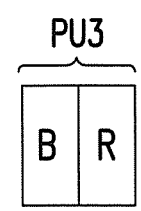
FIG. 4D     FIG. 4E     FIG. 4F

| R | G | B | G | R | B |
|---|---|---|---|---|---|
| B | G | R | B | R | G |
| R | B | R | G | B | G |

| B | G | R | G | B | R |
|---|---|---|---|---|---|
| R | G | B | R | B | G |
| B | R | B | G | R | G |

| G | R | B | G | R | B |
|---|---|---|---|---|---|
| B | G | R | B | G | R |
| R | B | G | R | B | G |

| G | B | R | G | B | R |
|---|---|---|---|---|---|
| R | G | B | R | G | B |
| B | R | G | B | R | G |

| R | G | B | G | R | B |
|---|---|---|---|---|---|
| B | G | R | B | R | G |
| R | G | B | G | R | B |
| R | B | R | G | B | G |

| B | G | R | G | B | R |
|---|---|---|---|---|---|
| R | G | B | R | B | G |
| B | G | R | G | B | R |
| B | R | B | G | R | G |

|   |   |   |   |   |   |
|---|---|---|---|---|---|
| R | G | B | G | R | B |
| B | G | R | B | R | G |
| R | G | B | G | R | B |
| B | G | R | B | R | G |

|   |   |   |   |   |   |
|---|---|---|---|---|---|
| B | G | R | G | B | R |
| R | G | B | R | B | G |
| B | G | R | G | B | R |
| R | G | B | R | B | G |

DISPLAY PANEL

CROSS-REFERENCE TO RELATED APPLICATION

This application claims the priority benefit of Taiwan application serial no. 104100958, filed on Jan. 12, 2015. The entirety of the above-mentioned patent application is hereby incorporated by reference herein and made a part of this specification.

BACKGROUND

Technical Field

The invention relates to a display technique, and particularly relates to a display panel.

Related Art

Along with development of display technology, consumers have increasingly higher demands on display devices, and display panels are developed towards a trend of slimness, high image quality, low power consumption, etc. Particularly, regarding the display device, low poser consumption and high brightness are the focus of attention. Therefore, in recent years, RGBG (red, green, blue, green) display panel capable of increasing brightness is developed. The RGBG display panel includes sub-pixels having three colors of red, green and blue, and the brightness of the display panel is increased through the green pixels, and a small screen is used to implement a high resolution. Based on a characteristic that human eyes are not easy to identify blue and is easy to identify green, the sub-pixels of red, green and blue are arranged according to a ratio of 1:2:1 (R:G:B). However, sizes of the sub-pixels in the RGBG display panel are inconsistent, (for example, the size of the red sub-pixel and the blue sub-pixel is twice of the size of the green sub-pixel), which leads to problems that electrical characteristics of the sub pixels are different and transmittances thereof are decreased, and the display panel is difficult to fabricate.

On the other hand, in the display panel having a high image quality, when a resolution thereof (i.e., pixels per inch (ppi)) is greater than a maximum pixel density that can be identified by human eyes (i.e., a retina resolution, for example, 300 ppi), human eyes cannot identify a brightness vision center of every two pixels in the display panel. In other words, when a space between the adjacent red, green and blue sub-pixels in the display panel is excessively small, different color lights produced by the adjacent red, green, blue sub-pixels may have a color mixing problem.

Particularly, when the resolution of the display panel is increased, the transmittance thereof is relatively decreased, and the brightness of the display panel is accordingly decreased. Therefore, it is a target to be achieved by related technicians to develop a display panel with high transmittance, low power consumption and high brightness while maintaining a color performance thereof.

SUMMARY

The invention is directed to a display panel, which has a good pixel transmittance, good clarity and low power consumption.

The invention provides a display panel including a plurality of sub-pixel groups arranged repeatedly to form a pixel array. Each of the sub-pixel groups includes a plurality of first pixel units, a plurality of second pixel units and a plurality of third pixel units. Each of the first pixel units includes a first color sub-pixel and a second color sub-pixel, each of the second pixel units includes the second color sub-pixel and a third color sub-pixel, and each of the third pixel units includes the first color sub-pixel and the third color sub-pixel. The first color sub-pixel, the second color sub-pixel and the third color sub-pixel are sub-pixels having three different colors, where at least a part of the first pixel units and at least a part of the second pixel units are arranged along a first direction, and the first direction is tilted relative to a column direction of the pixel array.

In an embodiment of the invention, each of the first pixel units, each of the second pixel units and each of the third pixel units are arranged in interleave along a row direction of the pixel array. Moreover, in the column direction of the pixel array, two pixel units adjacent to each of the first pixel units are different to the first pixel unit, two pixel units adjacent to each of the second pixel units are different to the second pixel unit, and two pixel units adjacent to each of the third pixel units are different to the third pixel unit.

In an embodiment of the invention, the at least a part of the third pixel units are arranged along the first direction.

In an embodiment of the invention, the other part of the first pixel units are arranged along a second direction, the other part of the second pixel units are arranged along the second direction, and the other part of the third pixel units are arranged along the second direction, where the second direction is tilted relative to the column direction of the pixel array.

In an embodiment of the invention, the first direction is not parallel to the second direction.

In an embodiment of the invention, in a plurality of first columns along the column direction of the pixel array, one of the second pixel units and the third pixel units is configured between each two of the first pixel units, and the second pixel units and the third pixel units are arranged in interleave between the first pixel units. In the first columns of the pixel array, four pixel units adjacent to each of the second pixel units are respectively one third pixel unit and three first pixel units, and the one third pixel unit is located at a first side of each of the second pixel units, and the three first pixel units are respectively located a second side, a third side and a fourth side of each of the second pixel units, where the two first pixel units located at the second side and the third side of each of the second pixel units are arranged along the first direction, and the two first pixel units located at the third side and the fourth side of each of the second pixel units are arranged along the second direction. In the first columns of the pixel array, four pixel units adjacent to each of the third pixel units are respectively three first pixel units and one second pixel unit, and the three first pixel units are respectively located at a first side, a second side and a fourth side of each of the third pixel units, and the one second pixel unit is located a third side of the third pixel unit, where the two first pixel units located at the first side and the second side of each of the third pixel units are arranged along the second direction, and the two first pixel units located at the first side and the fourth side of each of the third pixel units are arranged along the first direction. In the first columns of the pixel array, the first pixel unit located at the fourth side of each of the second pixel units is the first pixel unit located at the first side of each of the third pixel units, and the first pixel units in each of the first columns and the first pixel units adjacent to each of the first columns present a zigzag arrangement. The first side and the third side are two sides adjacent to each of the second pixel units along the row direction, and the second side and the fourth side are two sides adjacent to each of the second pixel units along the column direction.

In an embodiment of the invention, in a plurality of second columns along the column direction of the pixel array, one of the second pixel units is configured between each two of the first pixel units, and the first pixel units and the second pixel units are arranged in interleave. In the second columns of the pixel array, four pixel units adjacent to each of the second pixel units are respectively one third pixel unit and three first pixel units, and the one third pixel unit is located at a first side of each of the second pixel units, and the three first pixel units are respectively located a second side, a third side and a fourth side of each of the second pixel units, where the two first pixel units located at the second side and the third side of each of the second pixel units are arranged along the first direction, and the two first pixel units located at the third side and the fourth side of each of the second pixel units are arranged along the second direction. In the second columns of the pixel array, the first pixel units in each of the second columns and the first pixel units adjacent to each of the second columns present a zigzag arrangement. The first side and the third side are two sides adjacent to each of the second pixel units along the row direction, and the second side and the fourth side are two sides adjacent to each of the second pixel units along the column direction.

In an embodiment of the invention, all of the first pixel units, all of the second pixel unit and all of the third pixel units are arranged along the first direction.

In an embodiment of the invention, along the column direction of the pixel array, the first pixel units, the second pixel units and the third pixel units in the pixel units of each column are arranged in interleave. Four pixel units adjacent to each of the first pixel units are respectively two second pixel units and two third pixel units, and the two second pixel units are respectively located at a first side and a second side of each of the first pixel units, and the two third pixel units are respectively located a third side and a fourth side of each of the first pixel units, where the two second pixel units and the two third pixel units adjacent to each of the first pixel units are respectively arranged along the first direction. Along the column direction of the pixel array, each of the first pixel units in each column and each of the first pixel units adjacent to the column are arranged along the first direction, and the first side and the third side are two sides adjacent to each of the first pixel units along the row direction, and the second side and the fourth side are two sides adjacent to each of the first pixel units along the column direction.

In an embodiment of the invention, all of the third pixel units are arranged along the column direction of the pixel array.

In an embodiment of the invention, along the row direction of the pixel array, one of the first pixel units and one of the second pixel units are configured between each two of the third pixel units, where in a plurality of third columns, each of the first pixel units and each of the second pixel units are arranged in interleave along the column direction of the pixel array, and in a plurality of fourth columns, each of the third pixel units is arranged along the column direction of the pixel array. In the third columns of the pixel array, each of the first pixel units in each of the third columns and each of the first pixel units adjacent to each of the third columns present a zigzag arrangement, and each of the second pixel units in each of the third columns and each of the second pixel units adjacent to each of the third columns present the zigzag arrangement.

In an embodiment of the invention, an arrangement of two sub-pixels in each of the first pixel units, each of the second pixel units and each of the third pixel units in odd rows of the pixel array is opposite to an arrangement of two sub-pixels in each of the first pixel units, each of the second pixel units and each of the third pixel units in even rows of the pixel array.

In an embodiment of the invention, the numbers of the first color sub-pixels, the second color sub-pixels and the third color sub-pixels in each of the sub-pixel groups are the same.

In an embodiment of the invention, the first color sub-pixel is a red sub-pixel, the second color sub-pixel is a green sub-pixel, and the third color sub-pixel is a blue sub-pixel, and in the pixel array, pixel units adjacent to each of the third pixel units all have the second color sub-pixel.

In an embodiment of the invention, the first color sub-pixel is a red sub-pixel, the second color sub-pixel is a green sub-pixel, and the third color sub-pixel is a blue sub-pixel. Along the row direction of the pixel array, the second color sub-pixels are not adjacent to each other along the row direction, and the sub-pixels adjacent to each of the second color sub-pixels are respectively the first color sub-pixel and the third color sub-pixel.

In an embodiment of the invention, the first color sub pixel is a red sub-pixel, the second color sub-pixel is a green sub-pixel, and the third color sub-pixel is a blue sub-pixel. In the pixel units of each column of the pixel array, each of the second color sub-pixels is located at a same side of a center line of the column along the column direction.

According to the above descriptions, the display panel of the invention includes a plurality of sub-pixel groups composed of red sub-pixels, blue sub-pixels and green sub-pixels of the same number, by which a production yield of the display panel is improved and the display panel is easy to be manufactured. Moreover, in the display panel of the invention, through the arrangement of the pixel units having the green sub-pixels, the resolution of the display panel and the quality of the display image are maintained. Particularly, by decreasing the number of the sub-pixels in the pixel units of the display panel, a pixel density in image display is decreased, so as to improve a transmittance of the display panel and mitigate the color mixing problem of caused by different color lights generated by the sub-pixels in the high resolution display panel.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3A to FIG. 3C are top views of pixel units according to exemplary embodiments of the invention.

FIG. 4A-FIG. 4F are top views of various pixel units according to exemplary embodiments of the invention.

FIG. 5A-FIG. 5E are top views of sub-pixel groups respectively composed of the pixel units shown in FIG. 4A-FIG. 4F according to the first exemplary embodiment of the invention.

FIG. 6 is a top view of a pixel array 1200 including a plurality of the sub-pixel groups 100 of FIG. 2 according to the first exemplary embodiment of the invention.

FIG. 9A and FIG. 9B are top views of sub-pixel groups respectively composed of the pixel units shown in FIG. 4A-FIG. 4F according to the second exemplary embodiment of the invention.

FIG. 12A and FIG. 12B are top views of sub-pixel groups respectively composed of the pixel units shown in FIG. 4A-FIG. 4F according to a third exemplary embodiment of the invention.

DETAILED DESCRIPTION OF DISCLOSED EMBODIMENTS

In order to improve a transmittance, clarity and yield of a display panel, by suitably arranging sub-pixels of different colors such as red sub-pixels, blue sub-pixels and green sub-pixels, a pixel density of the display panel is decreased, such that the display panel may have both of a good pixel transmittance and good clarity when displaying images. Therefore, manufacturing complexity and power consumption of high resolution display panel are effectively decreased.

Figure 1:
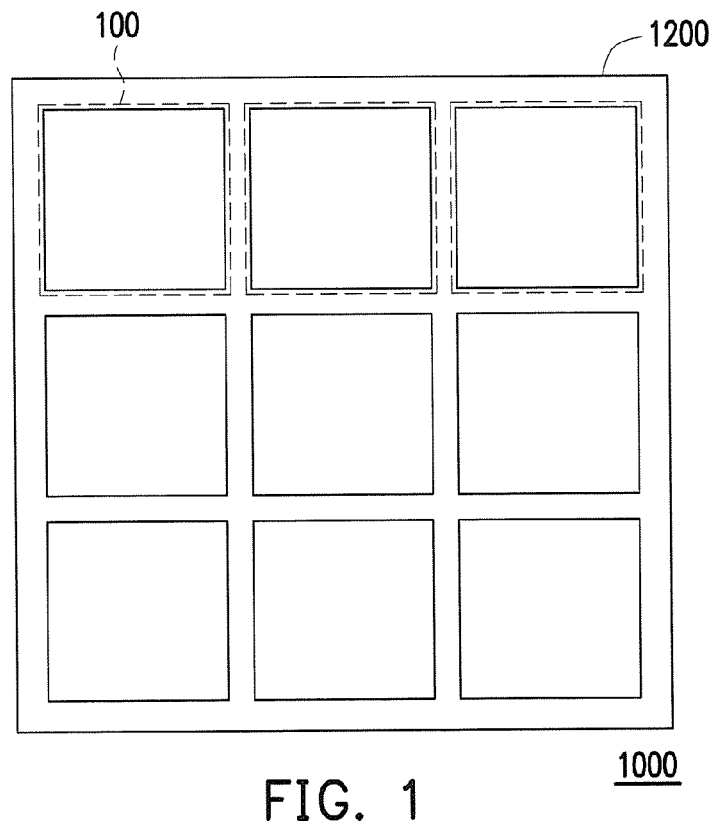
FIG. 1 top view of a pixel array of a display panel according to exemplary embodiments of the invention.
Figure 2:
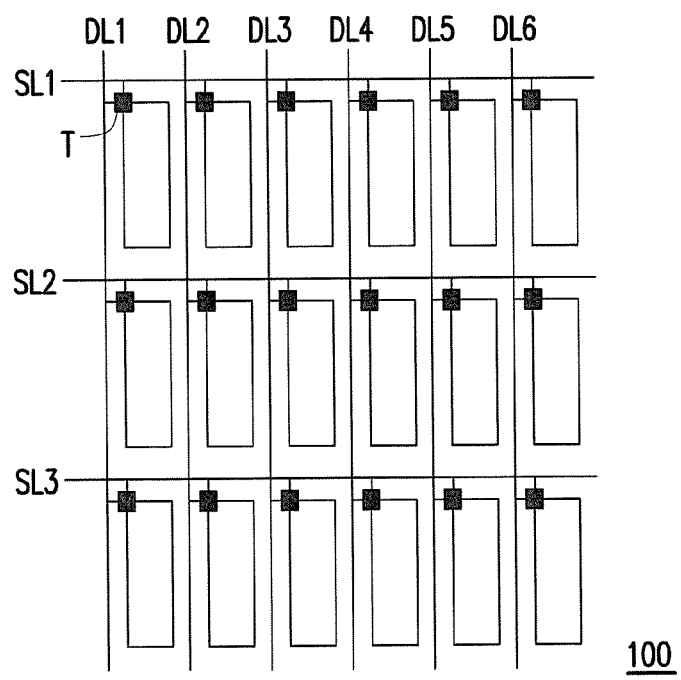
FIG. 2 is a top view of a sub-pixel group according to a first exemplary embodiment of the invention.

FIG. 1 top view of a pixel array of a display panel according to exemplary embodiments of the invention. FIG. 2 is a top view of a sub-pixel group according to a first exemplary embodiment of the invention.

Referring to FIG. 1 and FIG. 2, the display panel 1000 includes a plurality of sub-pixel groups 100, and the sub-pixel groups 100 are arranged repeatedly to form a pixel array 1200. For simplicity's sake, only one sub-pixel group 100 is illustrated in FIG. 2. Those skilled in the art should understand that the pixel array 1200 is substantially an array composed of a plurality of sub-pixel groups 100 (as shown in FIG. 1). The sub-pixel group 100 of the present exemplary embodiment includes 18 sub-pixels, and each of the sub-pixels includes a scan line, a data line and a driving element T. In case that the pixel array 1200 is applied to a liquid crystal display (LCD), the driving element T is, for example, a thin film transistor (TFT), though the invention is not limited thereto. If the pixel array 1200 is applied to an organic light-emitting diode (OLED), the driving element T, for example, includes two TFTs and one capacitor, though the invention is not limited thereto. The driving element T is electrically connected to the scan line and the data line. As shown in FIG. 2, each of the sub-pixel groups 100 of the present exemplary embodiment includes three scan lines SL1, SL2 and SL3 and six data lines DL1-DL6.

FIG. 3A to FIG. 3C are top views of pixel units according to exemplary embodiments of the invention.

Referring to FIG. 3A to FIG. 3C, to be specific, in the present exemplary embodiment, each of the sub-pixel groups 100 includes a plurality of first pixel units PU1, a plurality of second pixel units PU2 and a plurality of third pixel units PU3, where each pixel unit includes two sub-pixels. For example, each first pixel unit PU1 includes a first color sub-pixel SP1 and a second color sub-pixel SP2, each second pixel unit PU2 includes a second color sub-pixel SP2 and a third color sub-pixel SP3, and each third pixel unit PU3 includes a first color sub-pixel SP1 and a third color sub-pixel SP3, where the first color sub-pixel SP1, the second color sub-pixel SP2 and the third color sub-pixel SP3 are sub-pixels of three different colors.

FIG. 4A-FIG. 4F are top views of various pixel units according to exemplary embodiments of the invention.

Referring to FIG. 4A-FIG. 4F, in the pixel array 1200 of the display panel 1000, each pixel unit includes two sub-pixels with different colors, and the two sub-pixels with different colors are two of a red sub-pixel R, a blue sub-pixel B and a green sub-pixel G. For example, in the present exemplary embodiment, the first color sub-pixel SP1 is the red sub-pixel R, the second color sub-pixel SP2 is the green sub-pixel G, and the third color sub-pixel SP3 is the blue sub-pixel B. Therefore, as shown in FIG. 4A, the two sub-pixels with different colors included in the first pixel unit PU1 are sequentially the red sub-pixel R and the green sub-pixel G. In FIG. 4B, the two sub-pixels with different colors included in the second pixel unit PU2 are sequentially the blue sub-pixel B and the green sub-pixel G. In FIG. 4C, the two sub-pixels with different colors included in the third pixel unit PU3 are sequentially the red sub-pixel R and the blue sub-pixel B. However, the arrangement of the two sub-pixels with different colors in each pixel unit is not limited by the invention. For example, in an exemplary embodiment, the arrangement of the sub-pixels in the first pixel unit PU1 is sequentially the green sub-pixel G and the red sub-pixel R (shown in FIG. 4D), the arrangement of the sub-pixels in the second pixel unit PU2 is sequentially the green sub-pixel G and the blue sub-pixel B (shown in FIG. 4E), and the arrangement of the sub-pixels in the third pixel unit PU3 is sequentially the blue sub-pixel B and the red sub-pixel R (shown in FIG. 4F).

To be specific, in a general red-green-blue (RGB stripe) display panel, one pixel data includes three sub-pixels, i.e., the red sub-pixel R, the green sub-pixel G and the blue sub-pixel B. In the present exemplary embodiment of the invention, the pixel unit corresponding to one pixel data is composed of two sub-pixels. In detail, under a premise of the same size of the display panel, a size of the sub-pixels in the first pixel unit, the second pixel unit and the third pixel unit is 1.5 times greater than a size of the sub-pixels of a general pixel. In other words, since the size of the sub-pixels in the display panel of the invention is greater than that of the general RGB stripe display panel, a transmittance of the display panel 1000 is increased. Particularly, since a pixel density of the display panel 1000 of the invention is relatively small, a space between each adjacent red, green, blue sub-pixels is not excessively small, such that manufacturing complexity is decreased.

FIG. 5A-FIG. 5E are top views of sub-pixel groups respectively composed of the pixel units shown in FIG. 4A-FIG. 4F according to the first exemplary embodiment of the invention. For simplicity's sake, components such as the scan lines SL1, SL2 and SL3, the data lines DL1-DL6 and the driving elements T are not illustrated in FIG. 5A-FIG. 5E. The sub-pixel groups shown in FIG. 5A-FIG. 5E are similar to the sub-pixel group 100 of FIG. 2, so that the same or similar devices are denoted by the same or similar symbols, and descriptions thereof are not repeated. Arrangement of the sub-pixels in each of the sub-pixel groups of the present exemplary embodiment is described below with reference of figures.

Referring to FIG. 5A, the sub-pixel group 100a includes 18 sub-pixels arranged in a three-row six-column (3×6) array, which are respectively six red sub-pixels R, six green sub-pixels G and six blue sub-pixels B. In other words, a ratio of the numbers of the sub-pixels with different colors (i.e., the red sub-pixels R: the green sub-pixels G: the blue sub-pixels B) is 1:1:1. To be specific, viewing from the left to the right, a first row of the sub-pixel group 100a sequentially includes the red sub-pixel R, the green sub-pixel G, the blue sub-pixel B, the green sub-pixel G, the red sub-pixel R and the blue sub-pixel B; viewing from the left to the right, a second row of the sub-pixel group 100a sequentially includes the blue sub-pixel B, the green sub-pixel G, the red sub-pixel R, the blue sub-pixel B, the red sub-pixel R and the green sub-pixel G; and viewing from the left to the right, a third row of the sub-pixel group 100a sequentially includes the red sub-pixel R, the blue sub-pixel B, the red sub-pixel R, the green sub-pixel G, the blue sub-pixel B and the green sub-pixel G. In other words, viewing from the left to the right, the first row of the sub-pixel group 100a sequentially includes the first pixel unit PU1, the second pixel unit PU2 and the third pixel unit PU3; viewing from the left to the right, the second row of the sub-pixel group 100a sequentially includes the second pixel unit PU2, the third pixel unit PU3 and the first pixel unit PU1; and viewing from the left to the right, the third row of the sub-pixel group 100a sequentially includes the third pixel unit PU3, the first pixel unit PU1 and the second pixel unit PU2.

Referring to FIG. 5B, the sub-pixel group 100b includes 18 sub-pixels arranged in a three-row six-column (3×6) array, which are respectively six red sub-pixels R, six green sub-pixels G and six blue sub-pixels B. In other words, a ratio of the numbers of the sub-pixels with different colors (i.e., the red sub-pixels R: the green sub-pixels G: the blue sub-pixels B) is 1:1:1. Similarly, viewing from the left to the right, a first row of the sub-pixel group 100b sequentially includes the blue sub-pixel B, the green sub-pixel G, the red sub-pixel R, the green sub-pixel G, the blue sub-pixel B and the red sub-pixel R; viewing from the left to the right, a second row of the sub-pixel group 100b sequentially includes the red sub-pixel R, the green sub-pixel G, the blue sub-pixel B, the red sub-pixel R, the blue sub-pixel B and the green sub-pixel G; and viewing from the left to the right, a third row of the sub-pixel group 100b sequentially includes the blue sub-pixel B, the red sub-pixel R, the blue sub-pixel B, the green sub-pixel G, the red sub-pixel R and the green sub-pixel G. Namely, viewing from the left to the right, the first row of the sub-pixel group 100b sequentially includes the second pixel unit PU2, the first pixel unit PU1 and the third pixel unit PU3; viewing from the left to the right, the second row of the sub-pixel group 100b sequentially includes the first pixel unit PU1, the third pixel unit PU3 and the second pixel unit PU2; and viewing from the left to the right, the third row of the sub-pixel group 100b sequentially includes the third pixel unit PU3, the second pixel unit PU2 and the first pixel unit PU1. Particularly, if all of the red sub-pixels R in the sub-pixel group 100a of FIG. 5A are replaced by the blue sub-pixels B, and all of the blue sub-pixels B are replaced by the red sub-pixels R, the sub-pixel group 100b of FIG. 5B is obtained.

Referring to FIG. 5C, the sub-pixel group 100c includes 18 sub-pixels arranged in a three-row six-column (3×6) array, which are respectively six red sub-pixels R, six green sub-pixels G and six blue sub-pixels B. In other words, a ratio of the numbers of the sub-pixels with different colors (i.e., the red sub-pixels R: the green sub-pixels G: the blue sub-pixels B) is 1:1:1. Similarly, viewing from the left to the right, a first row of the sub-pixel group 100c sequentially includes the green sub-pixel G, the red sub-pixel R, the blue sub-pixel B, the green sub-pixel G, the red sub-pixel R and the blue sub-pixel B; viewing from the left to the right, a second row of the sub-pixel group 100c sequentially includes the blue sub-pixel B, the green sub-pixel G, the red sub-pixel R, the blue sub-pixel B, the green sub-pixel G and the red sub-pixel R; and viewing from the left to the right, a third row of the sub-pixel group 100c sequentially includes the red sub-pixel R, the blue sub-pixel B, the green sub-pixel G, the red sub-pixel R, the blue sub-pixel B and the green sub-pixel G. Namely, viewing from the left to the right, the first row of the sub-pixel group 100c sequentially includes the first pixel unit PU 1, the second pixel unit PU2 and the third pixel unit PU3; viewing from the left to the right, the second row of the sub-pixel group 100c sequentially includes the second pixel unit PU2, the third pixel unit PU3 and the first pixel unit PU1; and viewing from the left to the right, the third row of the sub-pixel group 100c sequentially includes the third pixel unit PU3, the first pixel unit PU1 and the second pixel unit PU2. Particularly, if positions of the red sub-pixels R and positions of the green sub-pixels G in all of the first pixel units PU1 in the sub-pixel group 100a of FIG. 5A are exchanged, the sub-pixel group 100c of FIG. 5C is obtained.

Referring to FIG. 5D, the sub-pixel group 100d includes 18 sub-pixels arranged in a three-row six-column (3×6) array, which are respectively six red sub-pixels R, six green sub-pixels G and six blue sub-pixels B. In other words, a ratio of the numbers of the sub-pixels with different colors (i.e., the red sub-pixels R: the green sub-pixels G: the blue sub-pixels B) is 1:1:1. Similarly, viewing from the left to the right, a first row of the sub-pixel group 100d sequentially includes the green sub-pixel G, the blue sub-pixel B, the red sub-pixel R, the green sub-pixel G, the blue sub-pixel B and the red sub-pixel R; viewing from the left to the right, a second row of the sub-pixel group 100d sequentially includes the red sub-pixel R, the green sub-pixel G, the blue sub-pixel B, the red sub-pixel R, the green sub-pixel G and the blue sub-pixel B; and viewing from the left to the right, a third row of the sub-pixel group 100d sequentially includes the blue sub-pixel B, the red sub-pixel R, the green sub-pixel G, the blue sub-pixel B, the red sub-pixel R and the green sub-pixel G. Namely, viewing from the left to the right, the first row of the sub-pixel group 100*d* sequentially includes the second pixel unit PU2, the first pixel unit PU1 and the third pixel unit PU3; viewing from the left to the right, the second row of the sub-pixel group 100*d* sequentially includes the first pixel unit PU1, the third pixel unit PU3 and the second pixel unit PU2; and viewing from the left to the right, the third row of the sub-pixel group 100*d* sequentially includes the third pixel unit PU3, the second pixel unit PU2 and the first pixel unit PU1. Particularly, if positions of the blue sub-pixels B and positions of the green sub-pixels G in all of the second pixel units PU2 in the sub-pixel group 100*b* of FIG. 5B are exchanged, the sub-pixel group 100*d* of FIG. 5D is obtained.

Figures 5E, 6:
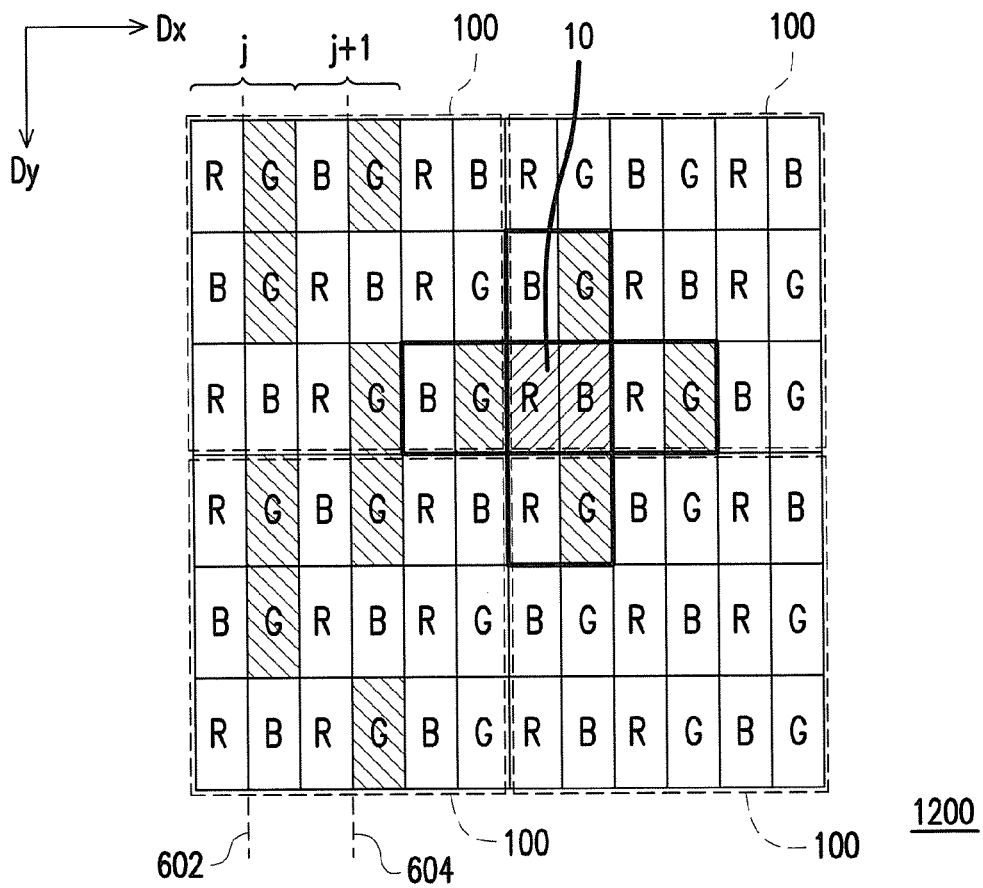

Referring to FIG. 5E, the sub-pixel group 100*e* includes 18 sub-pixels arranged in a three-row six-column (3×6) array, which are respectively six red sub-pixels R, six green sub-pixels G and six blue sub-pixels B. In other words, a ratio of the numbers of the sub-pixels with different colors (i.e., the red sub-pixels R: the green sub-pixels G: the blue sub-pixels B) is 1:1:1. Similarly, viewing from the left to the right, a first row of the sub-pixel group 100*e* sequentially includes the red sub-pixel R, the blue sub-pixel B, the green sub-pixel G, the red sub-pixel R, the blue sub-pixel B and the green sub-pixel G; viewing from the left to the right, a second row of the sub-pixel group 100*e* sequentially includes the green sub-pixel G, the blue sub-pixel B, the red sub-pixel R, the green sub-pixel G, the blue sub-pixel B and the red sub-pixel R; and viewing from the left to the right, a third row of the sub-pixel group 100*e* sequentially includes the red sub-pixel R, green sub-pixel G, the red sub-pixel R, the blue sub-pixel B, the green sub-pixel G and the blue sub-pixel B. Namely, viewing from the left to the right, the first row of the sub-pixel group 100*e* sequentially includes the third pixel unit PU3, the second pixel unit PU2 and the first pixel unit PU1; viewing from the left to the right, the second row of the sub-pixel group 100*e* sequentially includes the second pixel unit PU2, the first pixel unit PU1 and the third pixel unit PU3; and viewing from the left to the right, the third row of the sub-pixel group 100*e* sequentially includes the first pixel unit PU1, the third pixel unit PU3 and the second pixel unit PU2.

FIG. 6 is a top view of the pixel array 1200 including a plurality of the sub-pixel groups 100 of FIG. 2 according to the first exemplary embodiment of the invention.

For simplicity's sake, only four sub-pixel groups 100 are illustrated in FIG. 6, and components such as scan lines, data lines and driving elements are not illustrated. As shown in FIG. 6, the pixel array 1200 is fowled by a plurality of sub-pixel groups 100 arranged repeatedly. It should be noticed that the sub-pixel groups used for constructing the pixel array 1200 are not limited by the invention. For example, in the present exemplary embodiment, the pixel array 1200 is composed of the sub-pixel groups 100*a* of FIG. 5A. However, the invention is not limited thereto, for example, in another exemplary embodiment, the pixel array 1200 can be composed of the sub-pixel groups 100*b*, the sub-pixel groups 100*c*, the sub-pixel groups 100*d* and the sub-pixel groups 100*e* of FIG. 5B-FIG. 5E or composed of other sub-pixel groups.

Particularly, in the pixel array 1200 of FIG. 6, the pixel units adjacent to each of the third pixel units PU3 all have the second color sub-pixel (i.e., the green sub-pixel G). For example, in the present exemplary embodiment, the third pixel unit PU3 includes the red sub-pixel R and the blue sub-pixel B, and taking a third pixel unit 10 as an example, the four pixel units adjacent to the third pixel unit 10 all have the green sub-pixel G. Since the brightness of the green sub-pixel G is relatively high, the pixel units having the green sub-pixel G can maintain the resolution of the display panel, and since the brightness of the pixel unit without the green sub-pixel G is relatively low, such pixel unit may cause a dark point in a display image. Therefore, as the pixel units having the green sub-pixel G encircle the third pixel unit 10, the resolution of the display panel and the quality of the display image are effectively maintained.

Referring to FIG. 6 again, along a row direction $D_x$ of the pixel array 1200, the green sub-pixels G are not adjacent to each other along the row direction $D_x$, and the sub-pixels adjacent to each of the green sub-pixels G are respectively the red sub-pixel R and the blue sub-pixel B. Particularly, since the spaces between each of the adjacent red, green and blue sub-pixels in the display panel 1000 of the present exemplary embodiment of the invention are not excessively small; the display panel 1000 may have a good color-mixing effect according to such arrangement. On the other hand, in the pixel units of each column of the pixel array 1200, each of the green sub-pixels G is located at a same side of a center line of the column along a column direction $D_y$. For example, as shown in FIG. 6, the green sub-pixels G in the pixel units of a $j^{th}$ column are all located at the right side of a center line 602 of the $j^{th}$ column. Similarly, the green sub-pixels G in the pixel units of a $(j+1)^{th}$ column are all located at the right side of a center line 604 of the $(j+1)^{th}$ column, and so on. In the present exemplary embodiment, the green sub-pixels G of each column are all located at the right side of the center line of such column. In other words, since the green sub-pixels G in the pixel units of each column are arranged in a straight line along the column direction $D_y$, and are not deviated relative to the corresponding center line (i.e., located at the same side of the center line), a brightness vision center of the display panel is consistent, such that clarity of the display panel is maintained.

Figure 7A:
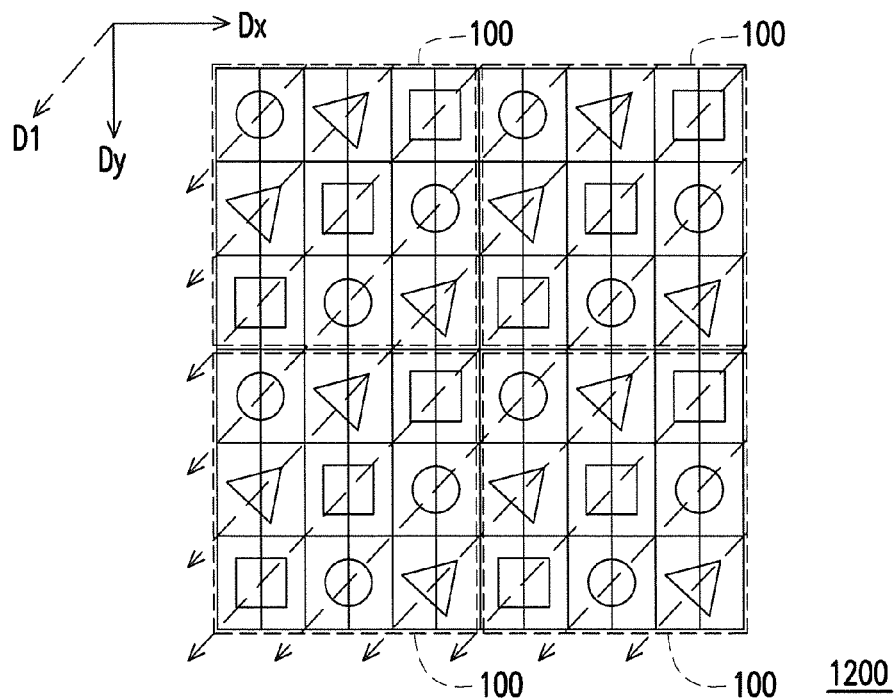
FIG. 7A and FIG. 7B are top views of arrangements of pixel units according to the first exemplary embodiment of the invention.
Figure 7B:
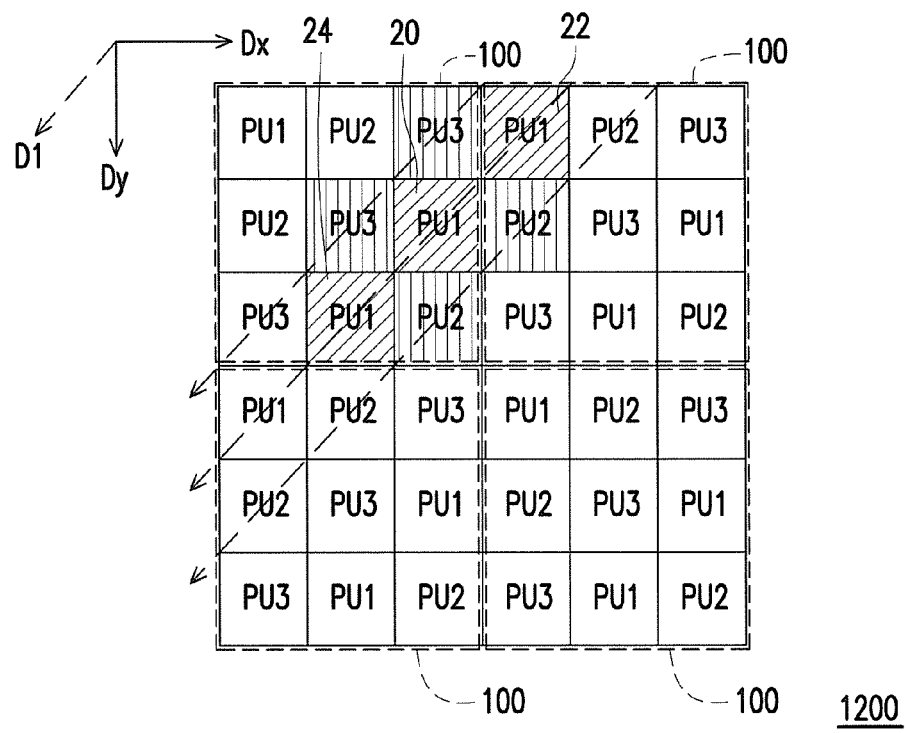

FIG. 7A and FIG. 7B are top views of arrangements of the pixel units according to the first exemplary embodiment of the invention.

Referring to FIG. 7A, in order to clearly present the arrangement of the pixel units, the first pixel units PU1 in the pixel array 1200 are represented by circles, the second pixel units PU2 in the pixel array 1200 are represented by triangles, and the third pixel units PU3 in the pixel array 1200 are represented by rectangles. In the present exemplary embodiment, all of the first pixel units PU1 in the pixel array 1200 formed by the sub-pixel groups 100 are arranged along a direction D1 (which is referred to as a first direction DO tilted relative to the column direction $D_y$ of the pixel array 1200, all of the second pixel units PU2 are arranged along the first direction D1, and all of the third pixel units PU3 are also arranged along the first direction D1. Particularly, each of the first pixel units PU1, each of the second pixel units PU2 and each of the third pixel units PU3 are arranged in interleave along the row direction $D_x$ of the pixel array 1200, and along each column direction $D_y$ of the pixel array 1200, the two pixel units adjacent to each of the first pixel units PU1 are different to the first pixel unit PU1, the two pixel units adjacent to each of the second pixel units PU2 are different to the second pixel unit PU2, and the two pixel units adjacent to each of the third pixel unit PU3 are different to the third pixel unit PU3.

Referring to FIG. 7B, in detail, along the column direction $D_y$ of the pixel array 1200, the first pixel units PU1, the second pixel units PU2 and the third pixel units PU3 in each column are arranged in interleave. The four pixel units adjacent to each of the first pixel units PU1 are respectively two second pixel units PU2 and two third pixel units PU3, and the two second pixel units PU2 are respectively located at a first side (i.e., a right side) and a second side (i.e., a lower side) of each of the first pixel units PU1, and the two third pixel units PU3 are respectively located a third side (i.e., a left side) and a fourth side (i.e., an upper side) of each of the first pixel units PU1. Here, taking a first pixel unit 20 as an example, the first side and the third side are two sides adjacent to the first pixel unit 20 along the row direction $D_x$, and the second side and the fourth side are two sides adjacent to the first pixel unit 20 along the column direction D. As shown in FIG. 7B, the two second pixel units PU2 located at the first side and the second side of the first pixel unit 20 and the two third pixel units PU3 located at the third side and the fourth side of the first pixel unit 20 are respectively arranged along the first direction D1. Particularly, the first pixel unit 20 and the first pixel units PU1 (i.e., the first pixel unit 22 and the first pixel unit 24) adjacent to such column are arranged along the first direction D1. Therefore, in the present exemplary embodiment, all of the first pixel units PU1, all of the second pixel units PU2 and all of the third pixel units PU3 in the pixel array 1200 are respectively arranged along the first direction D1, as shown in FIG. 7A.

Figure 8:
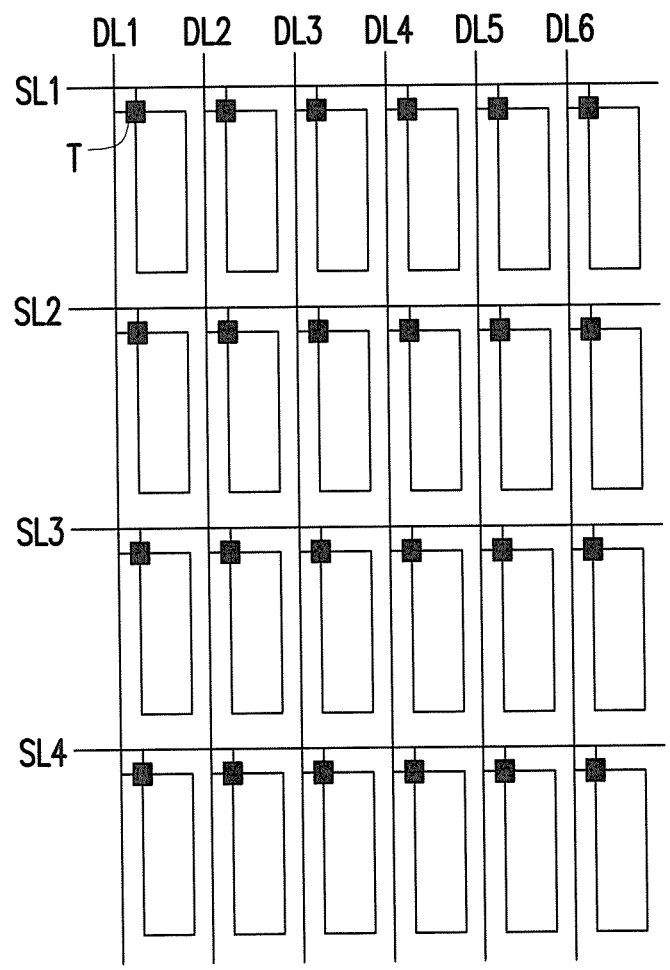
FIG. 8 is a top view of a sub-pixel group according to a second exemplary embodiment of the invention.

FIG. 8 is a top view of a sub-pixel group according to a second exemplary embodiment of the invention.

For simplicity's sake, only one sub-pixel group 200 is illustrated in FIG. 8. Those skilled in the art should understand that the pixel array 1200 of FIG. 1 can be composed of a plurality of the sub-pixel groups 200. The sub-pixel group 200 of the present exemplary embodiment includes 24 sub-pixels, and each of the sub-pixels includes a scan line, a data line and a driving element T. The driving element T is electrically connected to the scan line and the data line. As shown in FIG. 8, one sub-pixel group 200 of the present exemplary embodiment includes four scan lines SL1, SL2, SL3 and SL4 and six data lines DL1-DL6. The same to the first exemplary embodiment, in the pixel array 1200 of the display panel 1000, each of the sub-pixel groups 200 includes a plurality of first pixel units PU1, a plurality of second pixel units PU2 and a plurality of third pixel units PU3, where each pixel unit may include two sub-pixels with different colors. For example, in the present exemplary embodiment, arrangements of the sub-pixels with different colors in the first pixel unit PU1, the second pixel unit PU2 and the third pixel unit PU3 are the same to the arrangements shown in FIG. 4A to FIG. 4F, and details thereof are not repeated.

FIG. 9A and FIG. 9B are top views of sub-pixel groups respectively composed of the pixel units shown in FIG. 4A-FIG. 4F according to the second exemplary embodiment of the invention. For simplicity's sake, components such as the scan lines SL1, SL2, SL3 and SL4, the data lines DL1-DL6 and the driving elements T are not illustrated in FIG. 9A and FIG. 9B. The sub-pixel groups shown in FIG. 9A and FIG. 9B are similar to the sub-pixel group 200 of FIG. 8, so that the same or similar devices are denoted by the same or similar symbols, and descriptions thereof are not repeated. Arrangement of the sub-pixels in each of the sub-pixel groups of the present exemplary embodiment is described below with reference of figures.

Referring to FIG. 9A, the sub-pixel group 200a includes 24 sub-pixels arranged in a four-row six-column (4×6) array, which are respectively eight red sub-pixels R, eight green sub-pixels G and eight blue sub-pixels B. In other words, a ratio of the numbers of the sub-pixels with different colors (i.e., the red sub-pixels R: the green sub-pixels G: the blue sub-pixels B) is 1:1:1. To be specific, viewing from the left to the right, a first row of the sub-pixel group 200a sequentially includes the red sub-pixel R, the green sub-pixel G, the blue sub-pixel B, the green sub-pixel G, the red sub-pixel R and the blue sub-pixel B; viewing from the left to the right, a second row of the sub-pixel group 200a sequentially includes the blue sub-pixel B, the green sub-pixel G, the red sub-pixel R, the blue sub-pixel B, the red sub-pixel R and the green sub-pixel G; viewing from the left to the right, a third row of the sub-pixel group 200a sequentially includes the red sub-pixel R, the green sub-pixel G, the blue sub-pixel B, the green sub-pixel G, the red sub-pixel R and the blue sub-pixel B; and viewing from the left to the right, a fourth row of the sub-pixel group 200a sequentially includes the red sub-pixel R, the blue sub-pixel B, the red sub-pixel R, the green sub-pixel G, the blue sub-pixel B and the green sub-pixel G. In other words, viewing from the left to the right, the first row of the sub-pixel group 200a sequentially includes the first pixel unit PU1, the second pixel unit PU2 and the third pixel unit PU3; viewing from the left to the right, the second row of the sub-pixel group 200a sequentially includes the second pixel unit PU2, the third pixel unit PU3 and the first pixel unit PU1; viewing from the left to the right, the third row of the sub-pixel group 200a sequentially includes the first pixel unit PU1, the second pixel unit PU2 and the third pixel unit PU3; and viewing from the left to the right, the fourth row of the sub-pixel group 200a sequentially includes the third pixel unit PU3, the first pixel unit PU1 and the second pixel unit PU2.

Referring to FIG. 9B, the sub-pixel group 200b includes 24 sub-pixels arranged in a four-row six-column (4×6) array, which are respectively eight red sub-pixels R, eight green sub-pixels G and eight blue sub-pixels B. In other words, a ratio of the numbers of the sub-pixels with different colors (i.e., the red sub-pixels R: the green sub-pixels G: the blue sub-pixels B) is 1:1:1. Similarly, viewing from the left to the right, a first row of the sub-pixel group 200b sequentially includes the blue sub-pixel B, the green sub-pixel G, the red sub-pixel R, the green sub-pixel G, the blue sub-pixel B and the red sub-pixel R; viewing from the left to the right, a second row of the sub-pixel group 200b sequentially includes the red sub-pixel R, the green sub-pixel G, the blue sub-pixel B, the red sub-pixel R, the blue sub-pixel B and the green sub-pixel G; viewing from the left to the right, a third row of the sub-pixel group 200b sequentially includes the blue sub-pixel B, the green sub-pixel G, the red sub-pixel R, the green sub-pixel G, the blue sub-pixel B and the red sub-pixel R; and viewing from the left to the right, a fourth row of the sub-pixel group 200b sequentially includes the blue sub-pixel B, the red sub-pixel R, the blue sub-pixel B, the green sub-pixel G, the red sub-pixel R and the green sub-pixel G. In other words, viewing from the left to the right, the first row of the sub-pixel group 200b sequentially includes the second pixel unit PU2, the first pixel unit PU1 and the third pixel unit PU3; viewing from the left to the right, the second row of the sub-pixel group 200b sequentially includes the first pixel unit PU1, the third pixel unit PU3 and the second pixel unit PU2; viewing from the left to the right, the third row of the sub-pixel group 200b sequentially includes the second pixel unit PU2, the first pixel unit PU1 and the third pixel unit PU3; and viewing from the left to the right, the fourth row of the sub-pixel group 200b sequentially includes the third pixel unit PU3, the second pixel unit PU2 and the first pixel unit PU1. Particularly, if all of the red sub-pixels R in the sub-pixel group 200a of FIG. 9A are replaced by the blue sub-pixels B, and all of the blue sub-pixels B are replaced by the red sub-pixels R, the sub-pixel group 200b of FIG. 9B is obtained.

Figure 10:
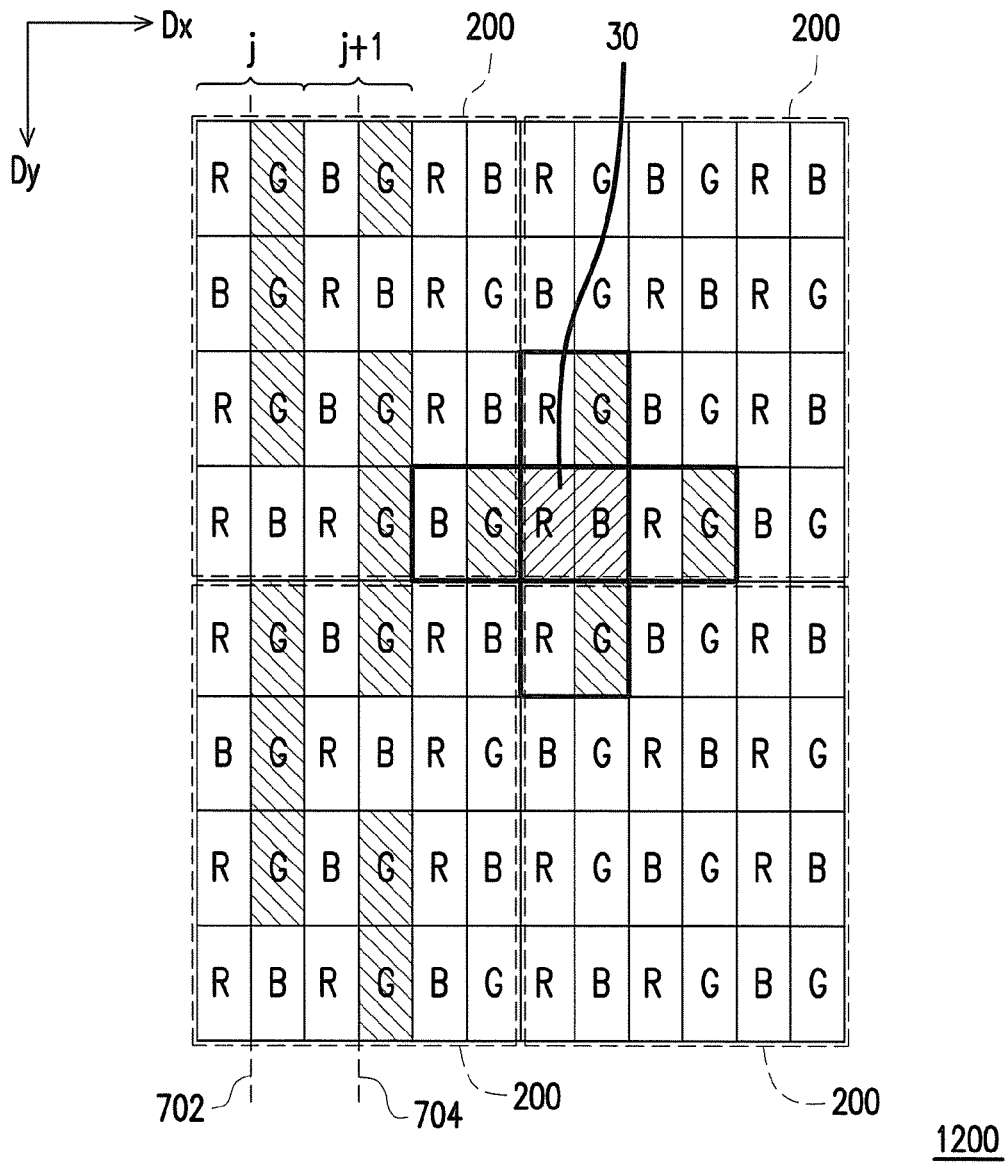
FIG. 10 is a top view of the pixel array 1200 including a plurality of the sub-pixel groups 200 of FIG. 8 according to the second exemplary embodiment of the invention.

FIG. 10 is a top view of the pixel array 1200 including a plurality of the sub-pixel groups 200 of FIG. 8 according to the second exemplary embodiment of the invention.

For simplicity's sake, only four sub-pixel groups 200 are illustrated in FIG. 10, and components such as scan lines, data lines and driving elements are not illustrated. As shown in FIG. 10, the pixel array 1200 is formed by a plurality of sub-pixel groups 200 arranged repeatedly. It should be noticed that the sub-pixel groups used for constructing the pixel array 1200 are not limited by the invention. For example, in the present exemplary embodiment, the pixel array 1200 is composed of the sub-pixel groups 200a of FIG. 9A. However, the invention is not limited thereto, for example, in another exemplary embodiment, the pixel array 1200 can be composed of the sub-pixel groups 200b of FIG. 9B or composed of other sub-pixel groups.

Referring to FIG. 10, in the pixel array 1200 of FIG. 10, the pixel units adjacent to each of the third pixel units PU3 all have the green sub-pixel G. For example, in the present exemplary embodiment, the third pixel unit PU3 includes the red sub-pixel R and the blue sub-pixel B, and taking a third pixel unit 30 as an example, the four pixel units adjacent to the third pixel unit 30 all have the green sub-pixel G. Since the brightness of the green sub-pixel G is relatively high, the pixel units having the green sub-pixel G can maintain the resolution of the display panel, and since the brightness of the pixel unit without the green sub-pixel G is relatively low, such pixel unit may cause a dark point in a display image. Therefore, as the pixel units having the green sub-pixel G encircle the third pixel unit 30, the resolution of the display panel and the quality of the display image are effectively maintained.

Referring to FIG. 10 again, the same to the first exemplary embodiment, along the row direction $D_x$ of the pixel array 1200, the green sub-pixels G are not adjacent to each other along the row direction $D_x$, and the sub-pixels adjacent to each of the green sub-pixels G are respectively the red sub-pixel R and the blue sub-pixel B. Particularly, since the spaces between each of the adjacent red, green and blue sub-pixels in the display panel 1000 of the present exemplary embodiment of the invention are not excessively small, the display panel 1000 may have a good color-mixing effect according to such arrangement, and manufacturing complexity thereof is decreased. On the other hand, in the pixel units of each column of the pixel array 1200, each of the green sub-pixels G is located at a same side of a center line of the column along the column direction $D_y$. For example, as shown in FIG. 10, the green sub-pixels G in the pixel units of a $j^{th}$ column are all located at the right side of a center line 702 of the $j^{th}$ column. Similarly, the green sub-pixels G in the pixel units of a $(j+1)^{th}$ column are all located at the right side of a center line 704 of the $(j+1)^{th}$ column, and so on. In the present exemplary embodiment, the green sub-pixels G of each column are all located at the right side of the center line of such column. In other words, since the green sub-pixels G in the pixel units of each column are arranged in a straight line along the column direction $D_y$, and are not deviated relative to the corresponding center line (i.e., located at the same side of the center line), a brightness vision center of the display panel is consistent, such that clarity of the display panel is maintained.

Figure 11A:
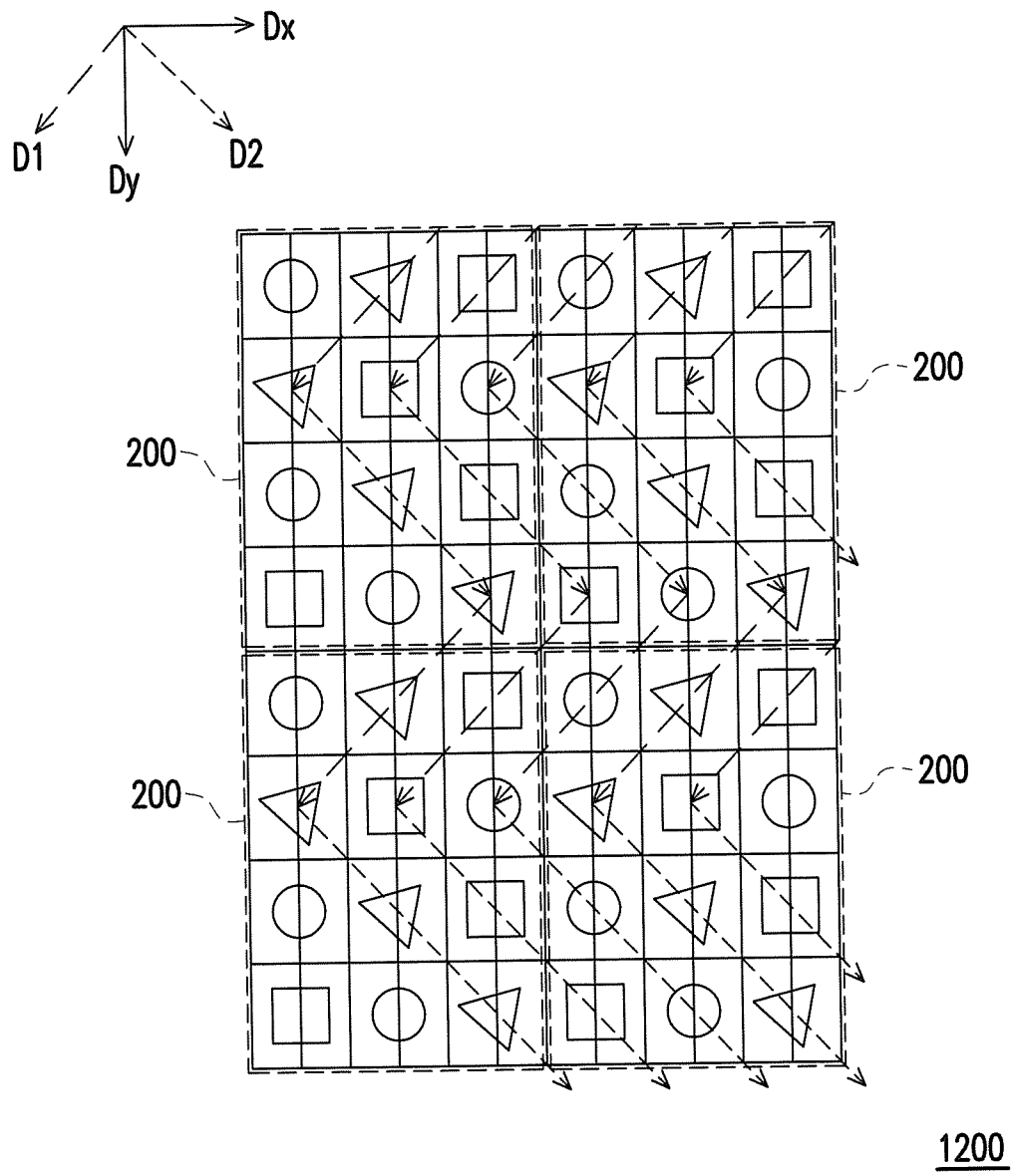
FIG. 11A and FIG. 11B are top views of arrangements of pixel units according to the second exemplary embodiment of the invention.
Figure 11B:
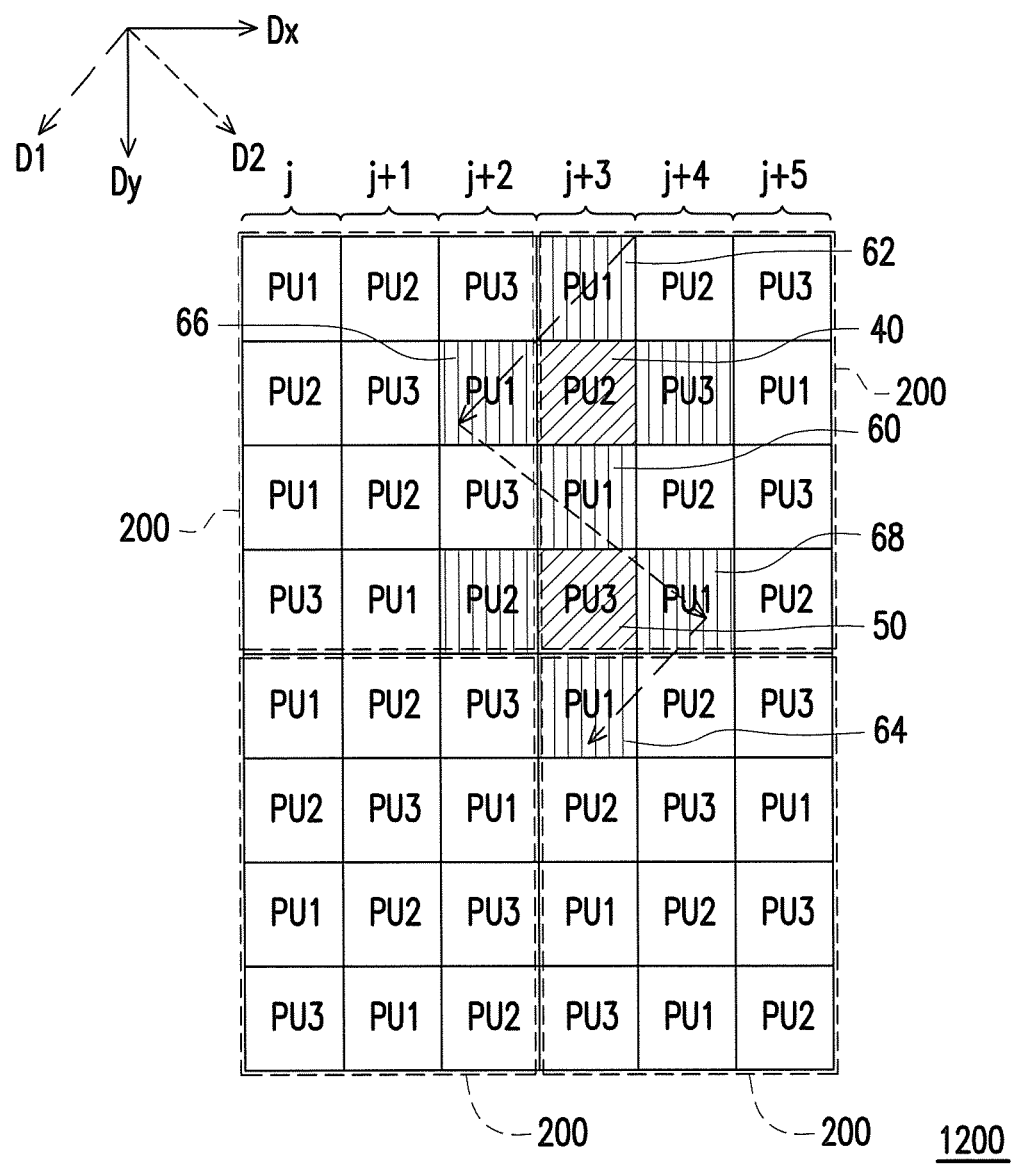

FIG. 11A and FIG. 11B are top views of arrangements of the pixel units according to the second exemplary embodiment of the invention.

Referring to FIG. 11A, in order to clearly present the arrangement of the pixel units, the first pixel units PU1 in the pixel array 1200 are represented by circles, the second pixel units PU2 in the pixel array 1200 are represented by triangles, and the third pixel units PU3 in the pixel array 1200 are represented by rectangles. In the present exemplary embodiment, different to the first exemplary embodiment, at least a part of the first pixel units PU1 in the pixel array 1200 formed by the sub-pixel groups 100 are arranged along the first direction D1 tilted relative to the column direction $D_y$ of the pixel array 1200, another part of the first pixel units PU1 are arranged along another direction (which is referred to as a second direction D2) tilted relative to the column direction $D_y$ of the pixel array 1200. Moreover, in the present exemplary embodiment, at least a part of the second pixel units PU2 are arranged along the first direction D1, and another part of the second pixel units PU2 are arranged along the second direction D2. Similarly, at least a part of the third pixel units PU3 are arranged along the first D1, and another part of the third pixel units PU3 are arranged along the second direction D2. It should be noticed that the first direction D1 is not parallel to the second direction D2.

Referring to FIG. 11B, in detail, in a $j^{th}$ column and a $(j+3)^{th}$ column of the pixel array 1200 along the column direction $D_y$, one of the second pixel unit PU2 and the third pixel unit PU3 is set between each two of the first pixel units PU1, and the second pixel units PU2 and the third pixel units PU3 are arranged in interleave between the first pixel units PU1. Taking the pixel units in the $(j+3)^{th}$ column as an example, in the $(j+3)^{th}$ column, the four pixel units adjacent to a second pixel unit 40 are respectively one third pixel unit PU3 and three first pixel units PU1, and the one third pixel unit PU3 is located at a first side (i.e., the right side) of the second pixel units 40, and the three first pixel units PU1 are respectively located a second side (i.e., the upper side), a third side (i.e., the left side) and a fourth side (i.e., the lower side) of the second pixel unit 40, where the two first pixel units PU1 (i.e., a first pixel unit 62 and a first pixel unit 66) located at the second side and the third side of the second pixel unit 40 are arranged along the first direction D1, and the two first pixel units PU1 (i.e., the first pixel unit 66 and a first pixel unit 60) located at the third side and the fourth side of the second pixel unit 40 are arranged along the second direction D2.

Moreover, in the $(j+3)^{th}$ column, the four pixel units adjacent to a third pixel unit 50 are respectively three first pixel unit PU1 and one second pixel units PU2, and the three first pixel units PU1 are respectively located at a first side (i.e., the right side), a second side (i.e., the upper side) and a fourth side (i.e., the lower side) of the third pixel units 50, and the one second pixel unit PU2 is located a third side (i.e., the left side) of the third pixel unit 50, where the two first pixel units PU1 (i.e., the first pixel unit 60 and a first pixel unit 68) located at the first side and the second side of the third pixel unit 50 are arranged along the second direction D2, and the two first pixel units PU1 (i.e., the first pixel unit 68 and a first pixel unit 64) located at the first side and the fourth side of the third pixel unit 50 are arranged along the first direction D1. Particularly, in the $(j+3)^{th}$ column, the first pixel unit PU1 (i.e., the first pixel unit 60) located at the fourth side of the second pixel unit 40 is the first pixel unit PU1 (i.e., the first pixel unit 60) located at the second side of the third pixel unit 50. Namely, the first pixel units PU1 (i.e., the first pixel unit 60, the first pixel unit 62 and the first pixel unit 64) in the $(j+3)^{th}$ column and the first pixel units PU1 located adjacent to the $(j+3)^{th}$ column (i.e., the first pixel unit 66 in a (j+2)$^{th}$ column and the first pixel unit 68 in a (j+4)$^{th}$ column) present a zigzag arrangement.

Deduced by analogy, the third pixel units PU3 in the (j+2)$^{th}$ column and the third pixel units PU3 located adjacent to the (j+2)$^{th}$ column present the zigzag arrangement, and the second pixel units PU2 in the (j+4)$^{th}$ column and the second pixel units PU2 located adjacent to the (j+4)$^{th}$ column present the zigzag arrangement. In other words, in the present exemplary embodiment, at least a part of the first pixel units PU1, at least a part of the second pixel units PU2 and at least a part of the third pixel units PU3 in the pixel array 1200 are arranged along the first direction D1, and the other part of the first pixel units PU1, the other part of the second pixel units PU2 and the other part of the third pixel units PU3 are arranged along the second direction D2. In this way, the first pixel units PU1, the second pixel units PU2 and the third pixel units PU3 in the pixel array 1200 are arranged along the first direction D1 and the second direction D2 and present the zigzag arrangement as shown in FIG. 11A. It should be noticed that in the present exemplary embodiment, the first side and the third side are two sides adjacent to each of the pixel units along the row direction $D_x$, and the second side and the fourth side are two sides adjacent to each of the pixel units along the column direction $D_y$.

FIG. 12A and FIG. 12B are top views of sub-pixel groups respectively composed of the pixel units shown in FIG. 4A-FIG. 4F according to a third exemplary embodiment of the invention. In the present exemplary embodiment, the sub-pixel groups of the display panel are the same to the sub-pixel groups 200 of FIG. 2 in the second exemplary embodiment. In other words, the sub-pixel groups 200 of the present exemplary embodiment can also construct the pixel array 1200 shown in FIG. 1, where the sub-pixel group 200 also includes 24 sub-pixels, and each of the sub-pixel groups 200 includes four scan lines SL1, SL2, SL3 and SL4 and six data lines DL1-DL6. The sub-pixel groups shown in FIG. 12A and FIG. 12B are similar to the sub-pixel group 200 of FIG. 8, so that the same or similar devices are denoted by the same or similar symbols, and descriptions thereof are not repeated. Arrangement of the sub-pixels in each of the sub-pixel groups of the present exemplary embodiment is described below with reference of figures.

Referring to FIG. 12A, the sub-pixel group 200c includes 24 sub-pixels arranged in a four-row six-column (4×6) array, which are respectively eight red sub-pixels R, eight green sub-pixels G and eight blue sub-pixels B. In other words, a ratio of the numbers of the sub-pixels with different colors (i.e., the red sub-pixels R: the green sub-pixels G: the blue sub-pixels B) is 1:1:1. To be specific, viewing from the left to the right, a first row of the sub-pixel group 200c sequentially includes the red sub-pixel R, the green sub-pixel G, the blue sub-pixel B, the green sub-pixel G, the red sub-pixel R and the blue sub-pixel B; viewing from the left to the right, a second row of the sub-pixel group 200c sequentially includes the blue sub-pixel B, the green sub-pixel G, the red sub-pixel R, the blue sub-pixel B, the red sub-pixel R and the green sub-pixel G; viewing from the left to the right, a third row of the sub-pixel group 200c sequentially includes the red sub-pixel R, the green sub-pixel G, the blue sub-pixel B, the green sub-pixel G, the red sub-pixel R and the blue sub-pixel B; and viewing from the left to the right, a fourth row of the sub-pixel group 200c sequentially includes the blue sub-pixel B, the green sub-pixel G, the red sub-pixel R, the blue sub-pixel G, the red sub-pixel R and the green sub-pixel G. In other words, viewing from the left to the right, the first row of the sub-pixel group 200c sequentially includes the first pixel unit PU1, the second pixel unit PU2 and the third pixel unit PU3; viewing from the left to the right, the second row of the sub-pixel group 200c sequentially includes the second pixel unit PU2, the third pixel unit PU3 and the first pixel unit PU1; viewing from the left to the right, the third row of the sub-pixel group 200c sequentially includes the first pixel unit PU1, the second pixel unit PU2 and the third pixel unit PU3; and viewing from the left to the right, the fourth row of the sub-pixel group 200c sequentially includes the second pixel unit PU2, the third pixel unit PU3 and the first pixel unit PU1.

Referring to FIG. 12B, the sub-pixel group 200d includes 24 sub-pixels arranged in a four-row six-column (4×6) array, which are respectively eight red sub-pixels R, eight green sub-pixels G and eight blue sub-pixels B. In other words, a ratio of the numbers of the sub-pixels with different colors (i.e., the red sub-pixels R: the green sub-pixels G: the blue sub-pixels B) is 1:1:1. Similarly, viewing from the left to the right, a first row of the sub-pixel group 200d sequentially includes the blue sub-pixel B, the green sub-pixel G, the red sub-pixel R, the green sub-pixel G, the blue sub-pixel B and the red sub-pixel R; viewing from the left to the right, a second row of the sub-pixel group 200d sequentially includes the red sub-pixel R, the green sub-pixel G, the blue sub-pixel B, the red sub-pixel R, the blue sub-pixel B and the green sub-pixel G; viewing from the left to the right, a third row of the sub-pixel group 200d sequentially includes the blue sub-pixel B, the green sub-pixel G, the red sub-pixel R, the green sub-pixel G, the blue sub-pixel B and the red sub-pixel R; and viewing from the left to the right, a fourth row of the sub-pixel group 200d sequentially includes the red sub-pixel R, the green sub-pixel G, the blue sub-pixel B, the red sub-pixel R, the blue sub-pixel B and the green sub-pixel G. In other words, viewing from the left to the right, the first row of the sub-pixel group 200d sequentially includes the second pixel unit PU2, the first pixel unit PU1 and the third pixel unit PU3; viewing from the left to the right, the second row of the sub-pixel group 200d sequentially includes the first pixel unit PU1, the third pixel unit PU3 and the second pixel unit PU2; viewing from the left to the right, the third row of the sub-pixel group 200d sequentially includes the second pixel unit PU2, the first pixel unit PU1 and the third pixel unit PU3; and viewing from the left to the right, the fourth row of the sub-pixel group 200d sequentially includes the first pixel unit PU1, the third pixel unit PU3 and the second pixel unit PU2. Particularly, if all of the red sub-pixels R in the sub-pixel group 200c of FIG. 12A are replaced by the blue sub-pixels B, and all of the blue sub-pixels B are replaced by the red sub-pixels R, the sub-pixel group 200d of FIG. 12B is obtained.

Figure 13:
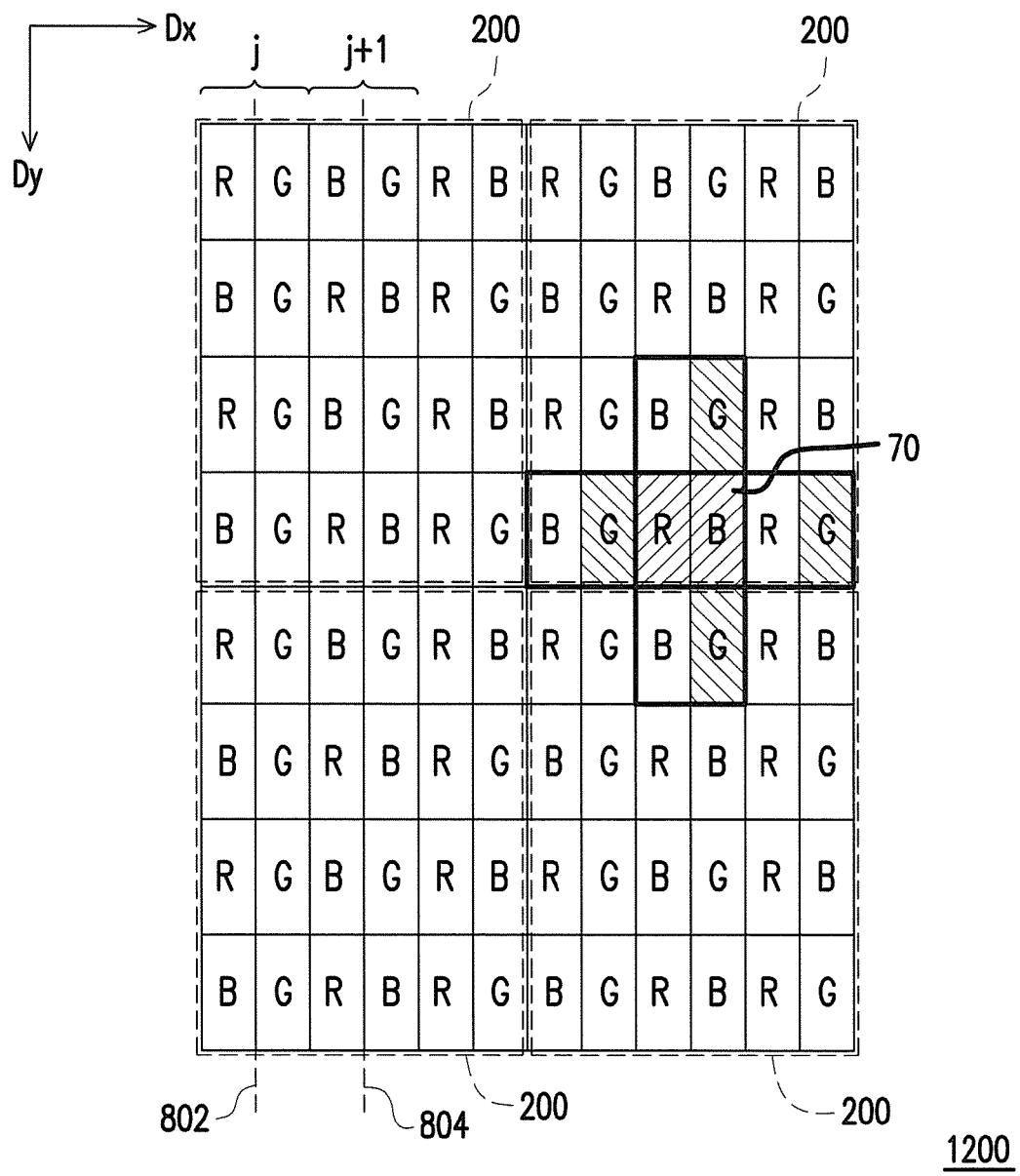
FIG. 13 is a top view of the pixel array 1200 including a plurality of the sub-pixel groups 200 of FIG. 8 according to the third exemplary embodiment of the invention.

FIG. 13 is a top view of the pixel array 1200 including a plurality of the sub-pixel groups 200 of FIG. 8 according to the third exemplary embodiment of the invention.

For simplicity's sake, only four sub-pixel groups 200 are illustrated in FIG. 13, and components such as scan lines, data lines and driving elements are not illustrated. As shown in FIG. 13, the pixel array 1200 is formed by a plurality of sub-pixel groups 200 arranged repeatedly. It should be noticed that the sub-pixel groups used for constructing the pixel array 1200 are not limited by the invention. For example, in the present exemplary embodiment, the pixel array 1200 is composed of the sub-pixel groups 200c of FIG. 12A. However, the invention is not limited thereto, for example, in another exemplary embodiment, the pixel array 1200 can be composed of the sub-pixel groups 200d of FIG. 12B or composed of other sub-pixel groups.

Referring to FIG. 13, in the pixel array 1200 of FIG. 13, the pixel units adjacent to each of the third pixel units PU3 all have the green sub-pixel G. For example, in the present exemplary embodiment, the third pixel unit PU3 includes the red sub-pixel R and the blue sub-pixel B, and taking a third pixel unit 70 as an example, the four pixel units adjacent to the third pixel unit 70 all have the green sub-pixel G. Since the brightness of the green sub-pixel G is relatively high, the pixel units having the green sub-pixel G can maintain the resolution of the display panel, and since the brightness of the pixel unit without the green sub-pixel G is relatively low, such pixel unit may cause a dark point in a display image. Therefore, as the pixel units having the green sub-pixel G encircle the third pixel unit 70, the resolution of the display panel and the quality of the display image are effectively maintained.

Referring to FIG. 13 again, the same to the first exemplary embodiment and the second exemplary embodiment, along the row direction $D_x$ of the pixel array 1200, the green sub-pixels G are not adjacent to each other along the row direction $D_x$, and the sub-pixels adjacent to each of the green sub-pixels G are respectively the red sub-pixel R and the blue sub-pixel B. Particularly, since the spaces between each of the adjacent red, green and blue sub-pixels in the display panel 1000 of the present exemplary embodiment of the invention are not excessively small, the display panel 1000 may have a good color-mixing effect according to such arrangement, and manufacturing complexity thereof is decreased. On the other hand, in the pixel units of each column of the pixel array 1200, each of the green sub-pixels G is located at a same side of a center line of the column along the column direction $D_y$. For example, as shown in FIG. 13, the green sub-pixels G in the pixel units of a $j^{th}$ column are all located at the right side of a center line 802 of the $j^{th}$ column. Similarly, the green sub-pixels G in the pixel units of a $(j+1)^{th}$ column are all located at the right side of a center line 804 of the $(j+1)^{th}$ column, and so on. In the present exemplary embodiment, the green sub-pixels G of each column are all located at the right side of the center line of such column. In other words, since the green sub-pixels G in the pixel units of each column are arranged in a straight line along the column direction $D_y$, and are not deviated relative to the corresponding center line (i.e., located at the same side of the center line), a brightness vision center of the display panel is consistent, such that clarity of the display panel is maintained.

Figure 14A:
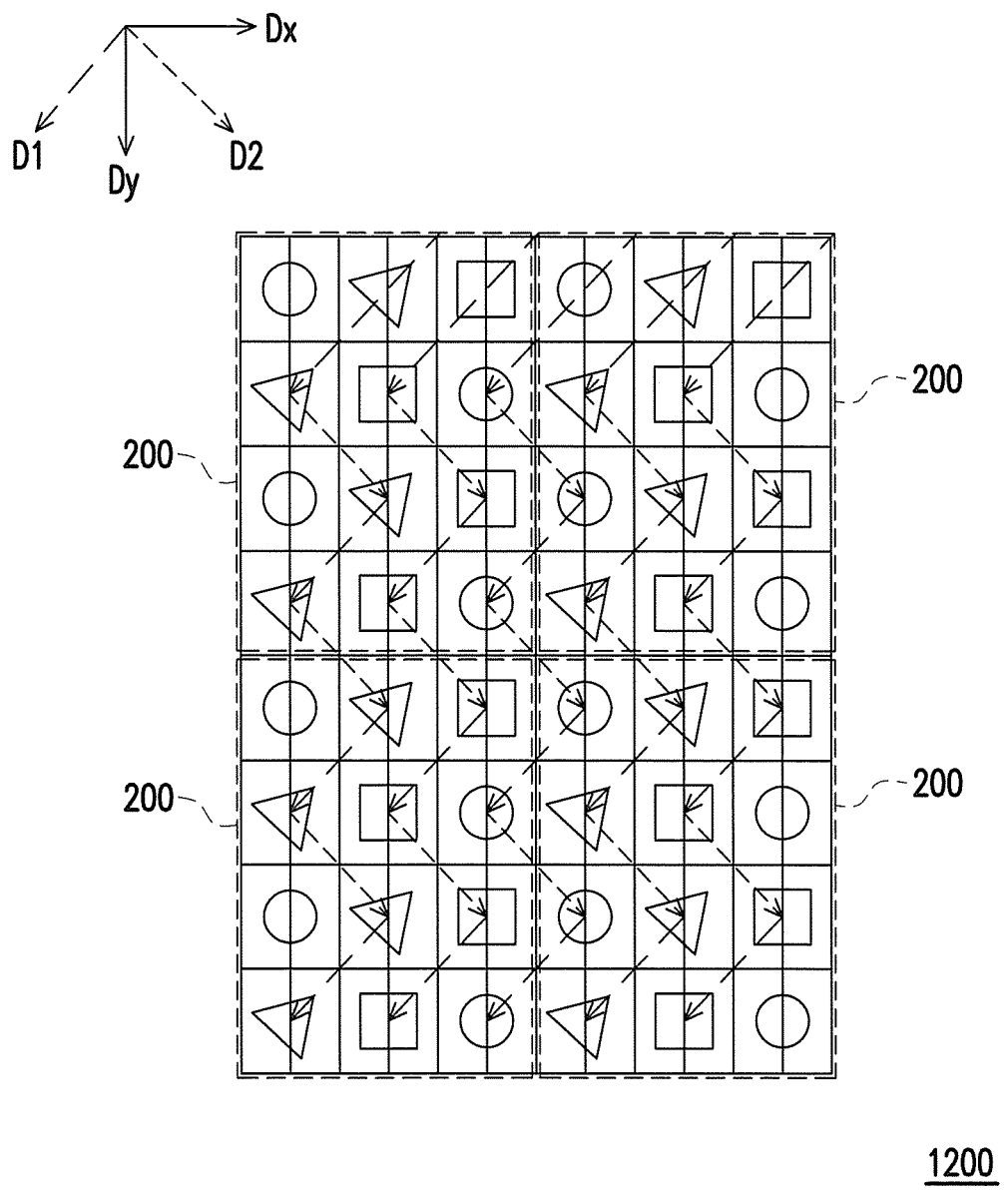
FIG. 14A and FIG. 14B are top views of arrangements of pixel units according to the third exemplary embodiment of the invention.
Figure 14B:
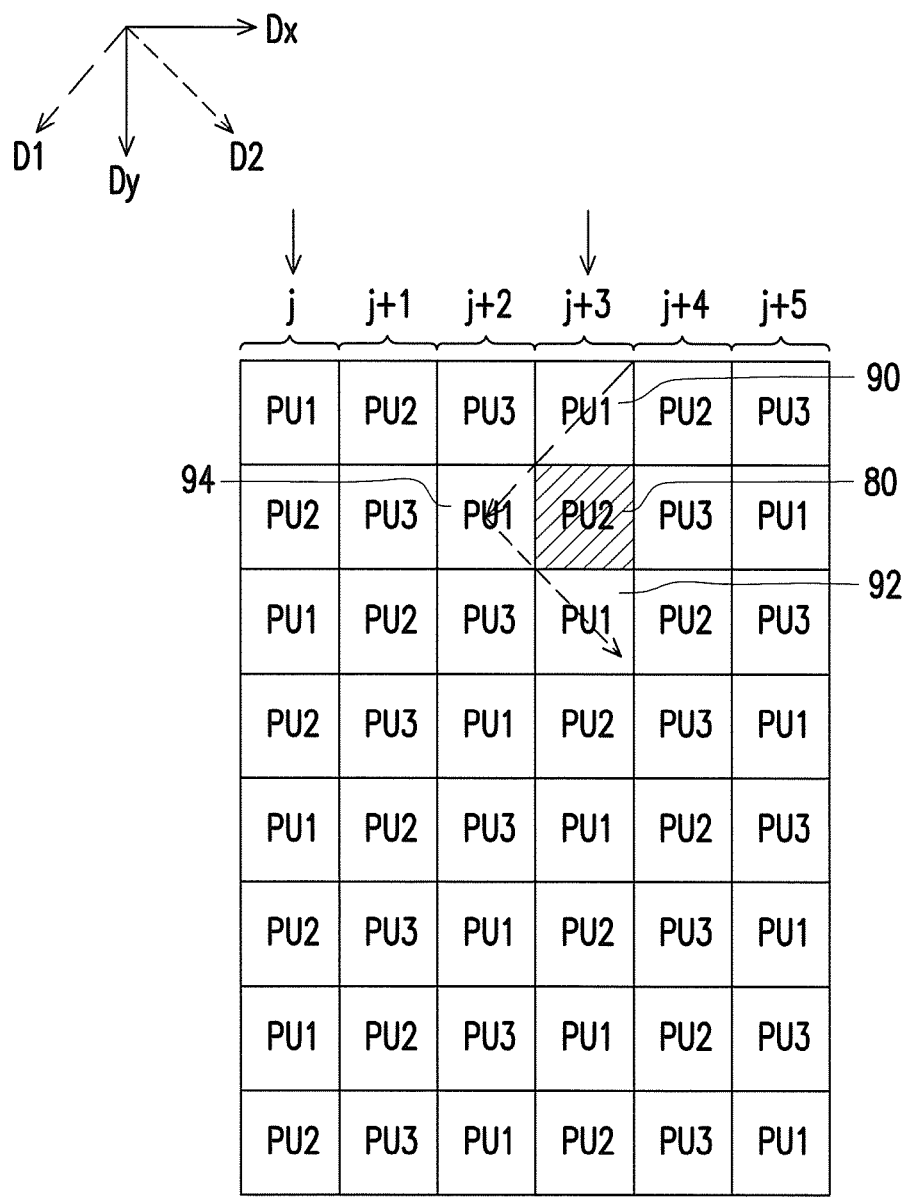

FIG. 14A and FIG. 14B are top views of arrangements of the pixel units according to the third exemplary embodiment of the invention.

Referring to FIG. 14A, in order to clearly present the arrangement of the pixel units, the first pixel units PU1 in the pixel array 1200 are represented by circles, the second pixel units PU2 in the pixel array 1200 are represented by triangles, and the third pixel units PU3 in the pixel array 1200 are represented by rectangles. In the present exemplary embodiment, the same to the second exemplary embodiment, at least a part of the first pixel units PU1 in the pixel array 1200 formed by the sub-pixel groups 100 are arranged along the first direction D1 tilted relative to the column direction $D_y$ of the pixel array 1200, another part of the first pixel units PU1 are arranged along the second direction D2 tilted relative to the column direction $D_y$ of the pixel array 1200. Moreover, at least a part of the second pixel units PU2 are arranged along the first direction D1, and another part of the second pixel units PU2 are arranged along the second direction D2. Similarly, at least a part of the third pixel units PU3 are arranged along the first D1, and another part of the third pixel units PU3 are arranged along the second direction D2. It should be noticed that the first direction D1 is not parallel to the second direction D2.

Referring to FIG. 14B, in detail, in the present exemplary embodiment, a difference between the third exemplary embodiment and the second exemplary embodiment is that in a $j^{th}$ column and a $(j+3)^{th}$ column of the pixel array 1200 along the column direction $D_y$, one of the second pixel units PU2 is set between each two of the first pixel units PU1, and the first pixel units PU1 and the second pixel units PU2 are arranged in interleave. Taking the $(j+3)^{th}$ column of the pixel array 1200 as an example, in the $(j+3)^{th}$ column, the four pixel units adjacent to a second pixel unit 80 are respectively one third pixel unit PU3 and three first pixel units PU1, and the one third pixel unit PU3 is located at a first side (i.e., the right side) of the second pixel units 80, and the three first pixel units PU1 are respectively located a second side (i.e., the upper side), a third side (i.e., the left side) and a fourth side (i.e., the lower side) of the second pixel unit 80, where the two first pixel units PU1 (i.e., a first pixel unit 90 and a first pixel unit 94) located at the second side and the third side of the second pixel unit 80 are arranged along the first direction D1, and the two first pixel units PU1 (i.e., the first pixel unit 94 and a first pixel unit 92) located at the third side and the fourth side of the second pixel unit 80 are arranged along the second direction D2. In other words, the first pixel units PU1 (i.e., the first pixel unit 90 and the first pixel unit 92) in the $(j+3)^{th}$ column and the first pixel units PU1 located adjacent to the $(j+3)^{th}$ column (i.e., the first pixel unit 94 in a $(j+2)^{th}$ column) present a zigzag arrangement, and similarly, all of the first pixel units PU1 in the $(j+3)^{th}$ column and all of the first pixel units PU1 in the $(j+2)^{th}$ column present the zigzag arrangement.

Deduced by analogy, the third pixel units PU3 in the $(j+2)^{th}$ column and the third pixel units PU3 located adjacent to the $(j+2)^{th}$ column present the zigzag arrangement, and the second pixel units PU2 in the $(j+4)^{th}$ column and the second pixel units PU2 located adjacent to the $(j+4)^{th}$ column present the zigzag arrangement. In other words, in the present exemplary embodiment, at least a part of the first pixel units PU1, at least a part of the second pixel units PU2 and at least a part of the third pixel units PU3 in the pixel array 1200 are arranged along the first direction D1, and the other part of the first pixel units PU1, the other part of the second pixel units PU2 and the other part of the third pixel units PU3 are arranged along the second direction D2. In this way, the first pixel units PU1, the second pixel units PU2 and the third pixel units PU3 in the pixel array 1200 are arranged along the first direction D1 and the second direction D2 and present the zigzag arrangement as shown in FIG. 14A. It should be noticed that in the present exemplary embodiment, the first side and the third side are two sides adjacent to each of the pixel units along the row direction $D_x$, and the second side and the fourth side are two sides adjacent to each of the pixel units along the column direction $D_y$.

Figure 15:
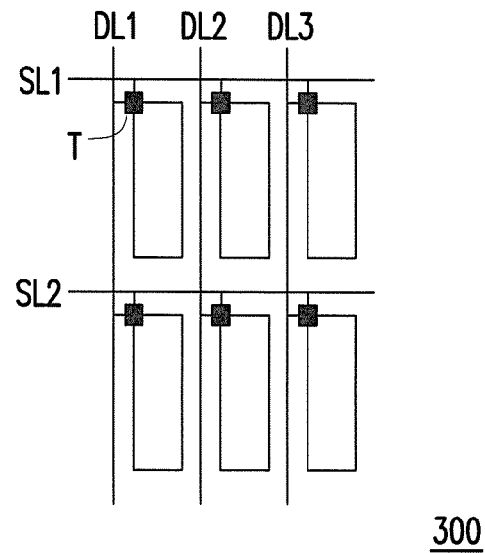
FIG. 15 is a top view of a sub-pixel group according to a fourth exemplary embodiment of the invention.

FIG. 15 is a top view of a sub-pixel group according to a fourth exemplary embodiment of the invention.

For simplicity's sake, only one sub-pixel group 300 is illustrated in FIG. 15. Those skilled in the art should understand that the pixel array 1200 of FIG. 1 can be composed of a plurality of the sub-pixel groups 300. The sub-pixel group 300 of the present exemplary embodiment includes 6 sub-pixels, and each of the sub-pixels includes a scan line, a data line and a driving element T. The driving element T is electrically connected to the scan line and the data line. As shown in FIG. 15, one sub-pixel group 300 of the present exemplary embodiment includes two scan lines SL1, and SL2 and three data lines DL1-DL3. The pixel array 1200 composed of a plurality of the sub-pixel groups 300 arranged repeatedly may include a plurality of first pixel units PU1, a plurality of second pixel units PU2 and a plurality of third pixel units PU3, where each pixel unit may include two sub-pixels with different colors. For example, in the present exemplary embodiment, arrangements of the sub-pixels with different colors in the first pixel unit PU1, the second pixel unit PU2 and the third pixel unit PU3 are the same to the arrangements shown in FIG. 4A to FIG. 4F, and details thereof are not repeated.

Figure 16A:
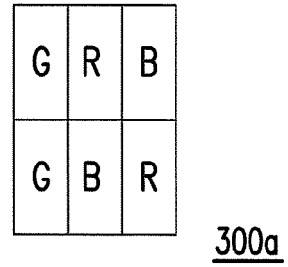
FIG. 16A and FIG. 16B are top views of sub-pixel groups according to the fourth exemplary embodiment of the invention.
Figure 16B:
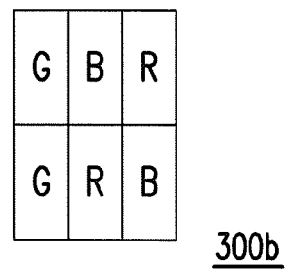

FIG. 16A and FIG. 16B are top views of sub-pixel groups according to the fourth exemplary embodiment of the invention. For simplicity's sake, the components such as the scan lines SL1, SL2, the data lines DL1-DL3 and the driving units T are not illustrated in FIG. 16A and FIG. 16B. The sub-pixel groups shown in FIG. 16A and FIG. 16B are similar to the sub-pixel group 300 of FIG. 15, so that the same or similar devices are denoted by the same or similar symbols, and descriptions thereof are not repeated. Arrangement of the sub-pixels in each of the sub-pixel groups of the present exemplary embodiment is described below with reference of figures.

Referring to FIG. 16A, the sub-pixel group 300a includes 6 sub-pixels arranged in a two-row three-column (2×3) array, which are respectively two red sub-pixels R, two green sub-pixels G and two blue sub-pixels B. In other words, a ratio of the numbers of the sub-pixels with different colors (i.e., the red sub-pixels R: the green sub-pixels G: the blue sub-pixels B) is 1:1:1. To be specific, viewing from the left to the right, a first row of the sub-pixel group 300a sequentially includes the green sub-pixel G, the red sub-pixel R and the blue sub-pixel B; and viewing from the left to the right, a second row of the sub-pixel group 300a sequentially includes the green sub-pixel G, the blue sub-pixel B and the red sub-pixel R.

Referring to FIG. 16B, the sub-pixel group 300b includes 6 sub-pixels arranged in a two-row three-column (2×3) array, which are respectively two red sub-pixels R, two green sub-pixels G and two blue sub-pixels B. In other words, a ratio of the numbers of the sub-pixels with different colors (i.e., the red sub-pixels R: the green sub-pixels G: the blue sub-pixels B) is 1:1:1. Similarly, viewing from the left to the right, a first row of the sub-pixel group 300b sequentially includes the green sub-pixel G, the blue sub-pixel B and the red sub-pixel R; and viewing from the left to the right, a second row of the sub-pixel group 300b sequentially includes the green sub-pixel G, the red sub-pixel R and the blue sub-pixel B. Particularly, if all of the red sub-pixels R in the sub-pixel group 300a of FIG. 16A are replaced by the blue sub-pixels B, and all of the blue sub-pixels B are replaced by the red sub-pixels R, the sub-pixel group 300b of FIG. 16B is obtained.

Figure 17:
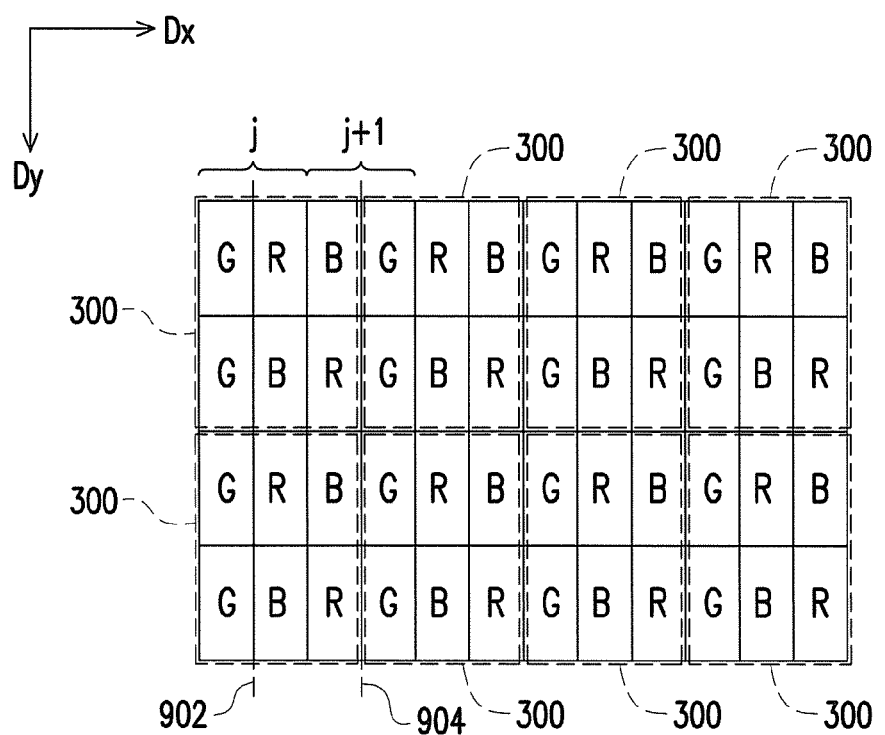
FIG. 17 is a top view of the pixel array 1200 including a plurality of the sub-pixel groups 300 of FIG. 15 according to the fourth exemplary embodiment of the invention.

FIG. 17 is a top view of the pixel array 1200 including a plurality of the sub-pixel groups 300 of FIG. 15 according to the fourth exemplary embodiment of the invention.

For simplicity's sake, only eight sub-pixel groups 300 are illustrated in FIG. 17, and components such as scan lines, data lines and driving elements are not illustrated. As shown in FIG. 17, the pixel array 1200 is formed by a plurality of sub-pixel groups 300 arranged repeatedly. It should be noticed that the sub-pixel groups used for constructing the pixel array 1200 are not limited by the invention. For example, in the present exemplary embodiment, the pixel array 1200 is composed of the sub-pixel groups 300a of FIG. 16A. However, the invention is not limited thereto, for example, in another exemplary embodiment, the pixel array 1200 can be composed of the sub-pixel groups 300b of FIG. 16B or composed of other sub-pixel groups.

Referring to FIG. 17, along the row direction $D_x$ of the pixel array 1200, the green sub-pixels G are not adjacent to each along the row direction $D_x$, and the sub-pixels adjacent each of the green sub-pixels G are respectively the red sub-pixel R and the blue sub-pixel B. Particularly, since the spaces between each of the adjacent red, green and blue sub-pixels in the display panel 1000 of the present exemplary embodiment of the invention are not excessively small, the display panel 1000 may have a good color-mixing effect according to such arrangement, and manufacturing complexity thereof is decreased. On the other hand, in the pixel units of each column of the pixel array 1200, each of the green sub-pixels G is located at a same side of a center line of the column along the column direction D. For example, as shown in FIG. 17, the green sub-pixels G in the pixel units of a $j^{th}$ column are all located at the right side of a center line 902 of the $j^{th}$ column. Similarly, the green sub-pixels G in the pixel units of a $(j+1)^{th}$ column are all located at the right side of a center line 904 of the $(j+1)^{th}$ column, and so on. In the present exemplary embodiment, the green sub-pixels G of each column are all located at the right side or the left side of the center line of such column. In other words, since the green sub-pixels G in the pixel units of each column are arranged in a straight line along the column direction $D_y$, and are not deviated relative to the corresponding center line (i.e., located at the same side of the center line), a brightness vision center of the display panel is consistent, such that clarity of the display panel is maintained.

Figure 18A:
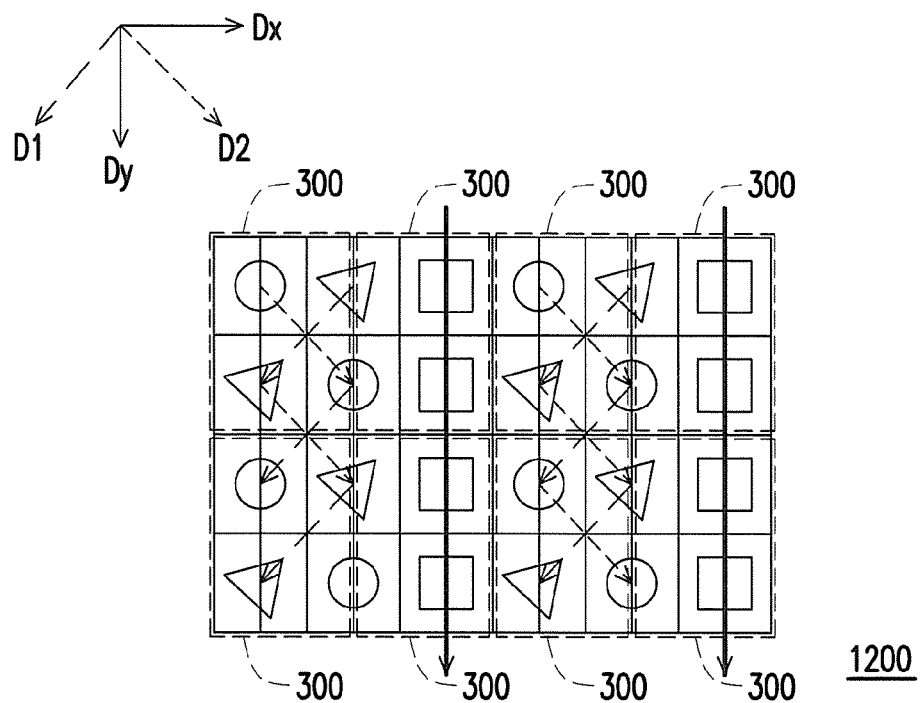
FIG. 18A and FIG. 18B are top views of arrangements of the pixel units according to the fourth exemplary embodiment of the invention.
Figure 18B:
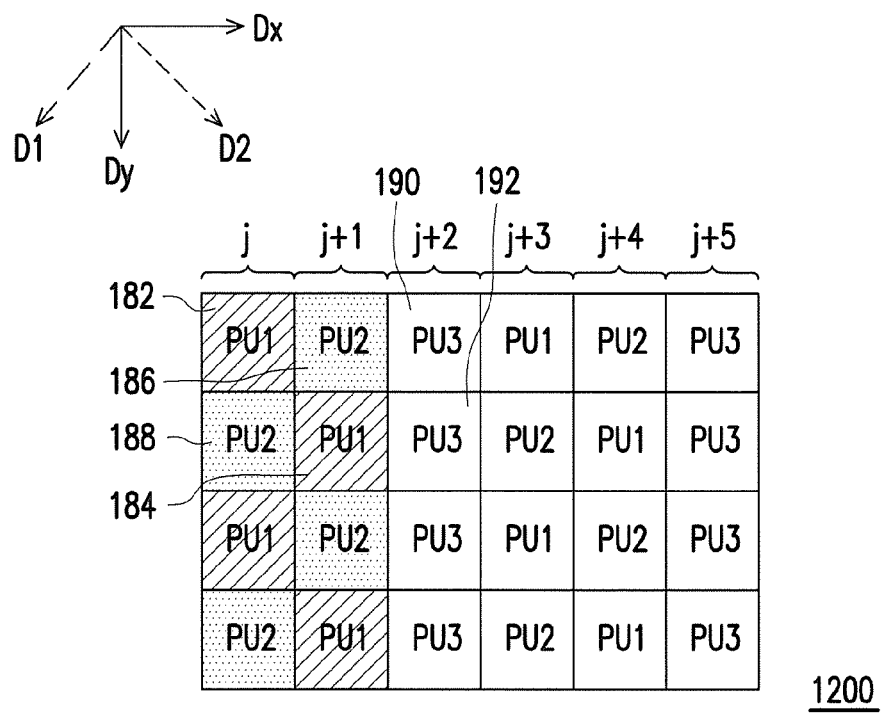

FIG. 18A and FIG. 18B are top views of arrangements of the pixel units according to the fourth exemplary embodiment of the invention.

Referring to FIG. 18A, in order to clearly present the arrangement of the pixel units, the first pixel units PU1 in the pixel array 1200 are represented by circles, the second pixel units PU2 in the pixel array 1200 are represented by triangles, and the third pixel units PU3 in the pixel array 1200 are represented by rectangles. In the present exemplary embodiment, at least a part of the first pixel units PU1 in the pixel array 1200 formed by the sub-pixel groups 100 are arranged along the first direction D1 tilted relative to the column direction $D_y$ of the pixel array 1200, and another part of the first pixel units PU1 are arranged along the second direction D2 tilted relative to the column direction $D_y$ of the pixel array 1200. Moreover, at least a part of the second pixel units PU2 are arranged along the first direction D1, and another part of the second pixel units PU2 are arranged along the second direction D2. It should be noticed that the first direction D1 is not parallel to the second direction D2. Different to the first to the third exemplary embodiments, in the present exemplary embodiment, all of the third pixel units PU3 are arranged along the column direction $D_y$ of the pixel array 1200.

Namely, in the present exemplary embodiment, each of the first pixel units PU1, each of the second pixel units PU2 and each of the third pixel units PU3 are arranged in interleave along the row direction $D_x$ of the pixel array 1200, and along the column direction $D_y$ of the pixel array 1200, the two pixel units adjacent to each of the first pixel units PU1 are different to the first pixel unit PU1, the two pixel units adjacent to each of the second pixel units PU2 are different to the second pixel unit PU2, and the two pixel units adjacent to each of the third pixel units PU3 are all the third pixel units PU3.

Referring to FIG. 18B, in detail, in the present exemplary embodiment, along the row direction $D_x$ of the pixel array 1200, one of the first pixel units PU1 and one of the second pixel units PU2 are set between each two of the third pixel units PU3. In a $j^{th}$ column, a $(j+1)^{th}$ column, a $(j+3)^{th}$ column and a $(j+4)^{th}$ column of the pixel array 1200 along the column direction $D_y$, the first pixel units PU1 and the second pixel units PU2 are arranged in interleave along the column direction $D_y$ of the pixel array 1200, and in a $(j+2)^{th}$ column and a $(j+5)^{th}$ column, the third pixel units PU3 are arranged along the column direction $D_y$ of the pixel array 1200. It should be noticed that in the present exemplary embodiment, the first pixel units PU1 of the $j^{th}$ column are not adjacent to the first pixel units PU1 of the $(j+1)^{th}$ column, and the first pixel units PU1 of the $(j+3)^{th}$ column are not adjacent to the first pixel units PU1 of the $(j+4)^{th}$ column. For example, a first pixel unit 182 is not adjacent to a first pixel unit 184. Therefore, the first pixel units PU1 of the $j^{th}$ column and the first pixel units PU1 located adjacent to the $j^{th}$ column (i.e., the first pixel units PU1 of the $(j+1)^{th}$ column) present a zigzag arrangement. Similarly, the second pixel units PU2 of the $j^{th}$ column are not adjacent to the second pixel units PU2 of the $(j+1)^{th}$ column, and the second pixel units PU2 of the $(j+3)^{th}$ column are not adjacent to the second pixel units PU2 of the $(j+4)^{th}$ column. For example, a second pixel unit 186 is not adjacent to a second pixel unit 188. Therefore, the second pixel units PU2 of the $(j+1)^{th}$ column and the second pixel units PU2 located adjacent to the $(j+1)^{th}$ column (i.e., the second pixel units PU2 of the $j^{th}$ column) present the zigzag arrangement.

Therefore, in the present embodiment, at least a part of the first pixel units PU1 and at least a part of the second pixel units PU2 in the pixel array 1200 are arranged along the first direction D1, and the other part of the first pixel units PU1 and the other part of the second pixel units PU2 are arranged along the second direction D2. Moreover, all of the third pixel units PU3 are arranged along the column direction $D_y$ of the pixel array 1200. Therefore, the first pixel units PU1 and the second pixel units PU2 of the pixel array 1200 are arranged along the first direction D1 and the second direction D2 as shown in FIG. 18A, and the third pixel units PU3 are arranged along the column direction $D_y$, and the first pixel units PU1, the second pixel units PU2 and the third pixel units PU3 respectively presents the zigzag arrangement and a straight line arrangement.

It should be noticed that in the present exemplary embodiment, the arrangement of the two sub-pixels in each of the first pixel units PU1, each of the second pixel units PU2 and each of the third pixel units PU3 in odd rows of the pixel array 1200 is opposite to the arrangement of the two sub-pixels in each of the first pixel units PU1, each of the second pixel units PU2 and each of the third pixel units PU3 in even rows of the pixel array 1200. For example, referring to FIG. 17 and FIG. 18B, the two sub-pixels in the first pixel unit 182 of the odd row are sequentially the green sub-pixel G and the red sub-pixel R, and the two sub-pixels in the first pixel unit 184 of the even row are sequentially the red sub-pixel R and the green sub-pixel G. Similarly, the two sub-pixels in the second pixel unit 186 of the odd row are sequentially the blue sub-pixel B and the green sub-pixel G, and the two sub-pixels in the second pixel unit 188 of the even row are sequentially the green sub-pixel G and the blue sub-pixel B. Moreover, the two sub-pixels in the third pixel unit 190 of the odd row are sequentially the red sub-pixel R and the blue sub-pixel B, and the two sub-pixels in the third pixel unit 192 of the even row are sequentially the blue sub-pixel B and the red sub-pixel R.

In summary, the display panel of the invention includes a plurality of sub-pixel groups composed of the red sub-pixels, the blue sub-pixels and the green sub-pixels of the same number, by which a production yield of the display panel is improved and the display panel is easy to be manufactured. Moreover, in the display panel of the invention, through the arrangement of the pixel units having the green sub-pixels, the resolution of the display panel and the quality of the display image are maintained. Particularly, by decreasing the number of the sub-pixels in the pixel units of the display panel, a pixel density in image display is decreased, so as to improve a transmittance of the display panel and decrease the manufacturing complexity and power consumption of the high resolution display panel. In this way, the display panel of the invention simultaneously have a good pixel transmittance, good clarity and a low power consumption.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A display panel, comprising:
   a plurality of sub-pixel groups, arranged repeatedly to form a pixel array, each of the sub-pixel groups comprising a plurality of first pixel units, a plurality of second pixel units and a plurality of third pixel units, wherein each of the first pixel units comprises a first color sub-pixel and a second color sub-pixel, each of the second pixel units comprises the second color sub-pixel and a third color sub-pixel, and each of the third pixel units comprises the first color sub-pixel and the third color sub-pixel, and the first color sub-pixel, the second color sub-pixel and the third color sub-pixel are sub-pixels having three different colors,
   wherein at least a part of the first pixel units are arranged along a first direction, at least a part of the second pixel units are arranged along the first direction, and the first direction is tilted relative to a column direction of the pixel array.

2. The display panel as claimed in claim 1, wherein each of the first pixel units, each of the second pixel units and each of the third pixel units are arranged in interleave along a row direction of the pixel array,
   wherein in the column direction of the pixel array, two pixel units adjacent to each of the first pixel units are different to the first pixel unit, two pixel units adjacent to each of the second pixel units are different to the second pixel unit, and two pixel units adjacent to each of the third pixel units are different to the third pixel unit.

3. The display panel as claimed in claim 1, wherein the at least a part of the third pixel units are arranged along the first direction.

4. The display panel as claimed in claim 3, wherein the other part of the first pixel units are arranged along a second direction, the other part of the second pixel units are arranged along the second direction, and the other part of the third pixel units are arranged along the second direction, wherein the second direction is tilted relative to the column direction of the pixel array.

5. The display panel as claimed in claim 4, wherein the first direction is not parallel to the second direction.

6. The display panel as claimed in claim 5, wherein in a plurality of first columns along the column direction of the pixel array, one of the second pixel units and the third pixel units is configured between each two of the first pixel units, and the second pixel units and the third pixel units are arranged in interleave between the first pixel units,
  wherein in the first columns of the pixel array, four pixel units adjacent to each of the second pixel units are respectively one third pixel unit and three first pixel units, and the one third pixel unit is located at a first side of each of the second pixel units, and the three first pixel units are respectively located a second side, a third side and a fourth side of each of the second pixel units, wherein the two first pixel units located at the second side and the third side of each of the second pixel units are arranged along the first direction, and the two first pixel units located the third side and the fourth side of each of the second pixel units are arranged along the second direction,
  in the first columns of the pixel array, four pixel units adjacent to each of the third pixel units are respectively three first pixel units and one second pixel unit, and the three first pixel units are respectively located at a first side, a second side and a fourth side of each of the third pixel units, and the one second pixel unit is located a third side of each of the third pixel units, wherein the two first pixel units located at the first side and the second side of each of the third pixel units are arranged along the second direction, and the two first pixel units located at the first side and the fourth side of each of the third pixel units are arranged along the first direction,
  wherein in the first columns of the pixel array, the first pixel unit located at the fourth side of each of the second pixel units is the first pixel unit located at the first side of each of the third pixel units, and the first pixel units in each of the first columns and the first pixel units adjacent to each of the first columns present a zigzag arrangement,
  wherein the first side and the third side are two sides adjacent to each of the second pixel units along the row direction, and the second side and the fourth side are two sides adjacent to each of the second pixel units along the column direction.

7. The display panel as claimed in claim 5, wherein in a plurality of second columns along the column direction of the pixel array, one of the second pixel units is configured between each two of the first pixel units, and the first pixel units and the second pixel units are arranged in interleave,
  wherein in the second columns of the pixel array, four pixel units adjacent to each of the second pixel units are respectively one third pixel unit and three first pixel units, and the one third pixel unit is located at a first side of each of the second pixel units, and the three first pixel units are respectively located a second side, a third side and a fourth side of each of the second pixel units, wherein the two first pixel units located at the second side and the third side of each of the second pixel units are arranged along the first direction, and the two first pixel units located at the third side and the fourth side of each of the second pixel units are arranged along the second direction,
  wherein in the second columns of the pixel array, the first pixel units in each of the second columns and the first pixel units adjacent to each of the second columns present a zigzag arrangement,
  wherein the first side and the third side are two sides adjacent to each of the second pixel units along the row direction, and the second side and the fourth side are two sides adjacent to each of the second pixel units along the column direction.

8. The display panel as claimed in claim 3, wherein all of the first pixel units, all of the second pixel unit and all of the third pixel units are arranged along the first direction.

9. The display panel as claimed in claim 8, wherein along the column direction of the pixel array, the first pixel units, the second pixel units and the third pixel units in the pixel units of each column are arranged in interleave,
  wherein four pixel units adjacent to each of the first pixel units are respectively two second pixel units and two third pixel units, and the two second pixel units are respectively located at a first side and a second side of each of the first pixel units, and the two third pixel units are respectively located a third side and a fourth side of each of the first pixel units, wherein the two second pixel units and the two third pixel units adjacent to each of the first pixel units are respectively arranged along the first direction,
  wherein along the column direction of the pixel array, each of the first pixel units in each column and each of the first pixel units adjacent to the column are arranged along the first direction,
  wherein the first side and the third side are two sides adjacent to each of the first pixel units along the row direction, and the second side and the fourth side are two sides adjacent to each of the first pixel units along the column direction.

10. The display panel as claimed in claim 1, wherein all of the third pixel units are arranged along the column direction of the pixel array.

11. The display panel as claimed in claim 10, wherein along a row direction of the pixel array, one of the first pixel units and one of the second pixel units are configured between each two of the third pixel units,
  wherein in a plurality of third columns, each of the first pixel units and each of the second pixel units are arranged in interleave along the column direction of the pixel array, and in a plurality of fourth columns, each of the third pixel units is arranged along the column direction of the pixel array,
  wherein in the third columns of the pixel array, each of the first pixel units in each of the third columns and each of the first pixel units adjacent to each of the third columns present a zigzag arrangement, and each of the second pixel units in each of the third columns and each of the second pixel units adjacent to each of the third columns present the zigzag arrangement.

12. The display panel as claimed in claim 11, wherein an arrangement of two sub-pixels in each of the first pixel units, each of the second pixel units and each of the third pixel units in odd rows of the pixel array is opposite to an arrangement of two sub-pixels in each of the first pixel units, each of the second pixel units and each of the third pixel units in even rows of the pixel array.

13. The display panel as claimed in claim 1, wherein the numbers of the first color sub-pixels, the second color sub-pixels and the third color sub-pixels in each of the sub-pixel groups are the same.

14. The display panel as claimed in claim 4, wherein the first color sub-pixel is a red sub-pixel, the second color sub-pixel is a green sub-pixel, and the third color sub-pixel is a blue sub-pixel,
  wherein in the pixel array, pixel units adjacent to each of the third pixel units all have the second color sub-pixel.

15. The display panel as claimed in claim 8, wherein the first color sub-pixel is a red sub-pixel, the second color sub-pixel is a green sub-pixel, and the third color sub-pixel is a blue sub-pixel, wherein in the pixel array, pixel units adjacent to each of the third pixel units all have the second color sub-pixel.

16. The display panel as claimed in claim 1, wherein the first color sub-pixel is a red sub-pixel, the second color sub-pixel is a green sub-pixel, and the third color sub-pixel is a blue sub-pixel, wherein along a row direction of the pixel array, the second color sub-pixels are not adjacent to each other along the row direction, and the sub-pixels adjacent to each of the second color sub-pixels are respectively the first color sub-pixel and the third color sub-pixel.

17. The display panel as claimed in claim 1, wherein the first color sub pixel is a red sub-pixel, the second color sub-pixel is a green sub-pixel, and the third color sub-pixel is a blue sub-pixel, wherein in the pixel units of each column of the pixel array, each of the second color sub-pixels is located at a same side of a center line of the column along the column direction.

\* \* \* \* \*